(12) United States Patent
Hoshi et al.

(10) Patent No.: US 8,446,446 B2
(45) Date of Patent: May 21, 2013

(54) OPTICAL DEVICE, OPTICAL SCANNING APPARATUS AND IMAGE FORMING APPARATUS

(75) Inventors: Fumikazu Hoshi, Miyagi (JP); Toshihiro Ishii, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 64 days.

(21) Appl. No.: 13/084,969

(22) Filed: Apr. 12, 2011

(65) Prior Publication Data

US 2011/0261139 A1 Oct. 27, 2011

(30) Foreign Application Priority Data

Apr. 23, 2010 (JP) ................................. 2010-099646

(51) Int. Cl.
*B41J 2/45* (2006.01)
(52) U.S. Cl.
USPC .......................................................... 347/238
(58) Field of Classification Search
USPC ................. 347/236–238, 241, 242, 246, 247, 347/256, 257
See application file for complete search history.

(56) References Cited

U.S. PATENT DOCUMENTS

| | | | |
|---|---|---|---|
| 5,809,050 | A | 9/1998 | Baldwin et al. |
| 6,639,931 | B1 | 10/2003 | Dowd et al. |
| 8,035,676 | B2 * | 10/2011 | Harasaka et al. ............. 347/238 |
| 2002/0172247 | A1 | 11/2002 | Sopra et al. |
| 2006/0104327 | A1 | 5/2006 | Karnutsch et al. |
| 2007/0014324 | A1 | 1/2007 | Maeda et al. |
| 2009/0285252 | A1 | 11/2009 | Ishii et al. |
| 2009/0285602 | A1 | 11/2009 | Harasaka et al. |
| 2009/0310632 | A1 | 12/2009 | Sugawara et al. |
| 2010/0046565 | A1 * | 2/2010 | Masui et al. ............... 372/45.01 |

FOREIGN PATENT DOCUMENTS

| | | | |
|---|---|---|---|
| EP | 0786838 | A2 | 7/1997 |
| EP | 805528 | A2 * | 11/1997 |
| JP | 10-51067 | | 2/1998 |
| JP | 3566902 | | 6/2004 |
| JP | 2004-289033 | | 10/2004 |
| JP | 2005-156933 | | 6/2005 |
| JP | 2005156933 | A * | 6/2005 |
| JP | 3955925 | | 5/2007 |
| JP | 2007-201398 | | 8/2007 |

OTHER PUBLICATIONS

Aug. 8, 2011 European search report in connection with counterpart European patent application No. 11 16 3521.

* cited by examiner

*Primary Examiner* — Hai C Pham
(74) *Attorney, Agent, or Firm* — Cooper & Dunham LLP

(57) ABSTRACT

An optical device includes at least one surface emitting laser device having a dielectric film for causing a central portion of a light emitting region to have a comparatively higher reflectivity than a peripheral portion; a light receiving element disposed, with respect to a first direction, on one side to the surface emitting laser device; and a transparent member disposed in a path of light emitted from the surface emitting laser device and configured to reflect a portion of the light toward the light receiving element as monitoring light. The central portion has shape anisotropy in which a width measured on a line extending in the first direction and passing through the center of the light emitting region is smaller than a width measured on a line extending in a second direction, which is perpendicular to the first direction, and passing through the center of the light emitting region.

18 Claims, 32 Drawing Sheets

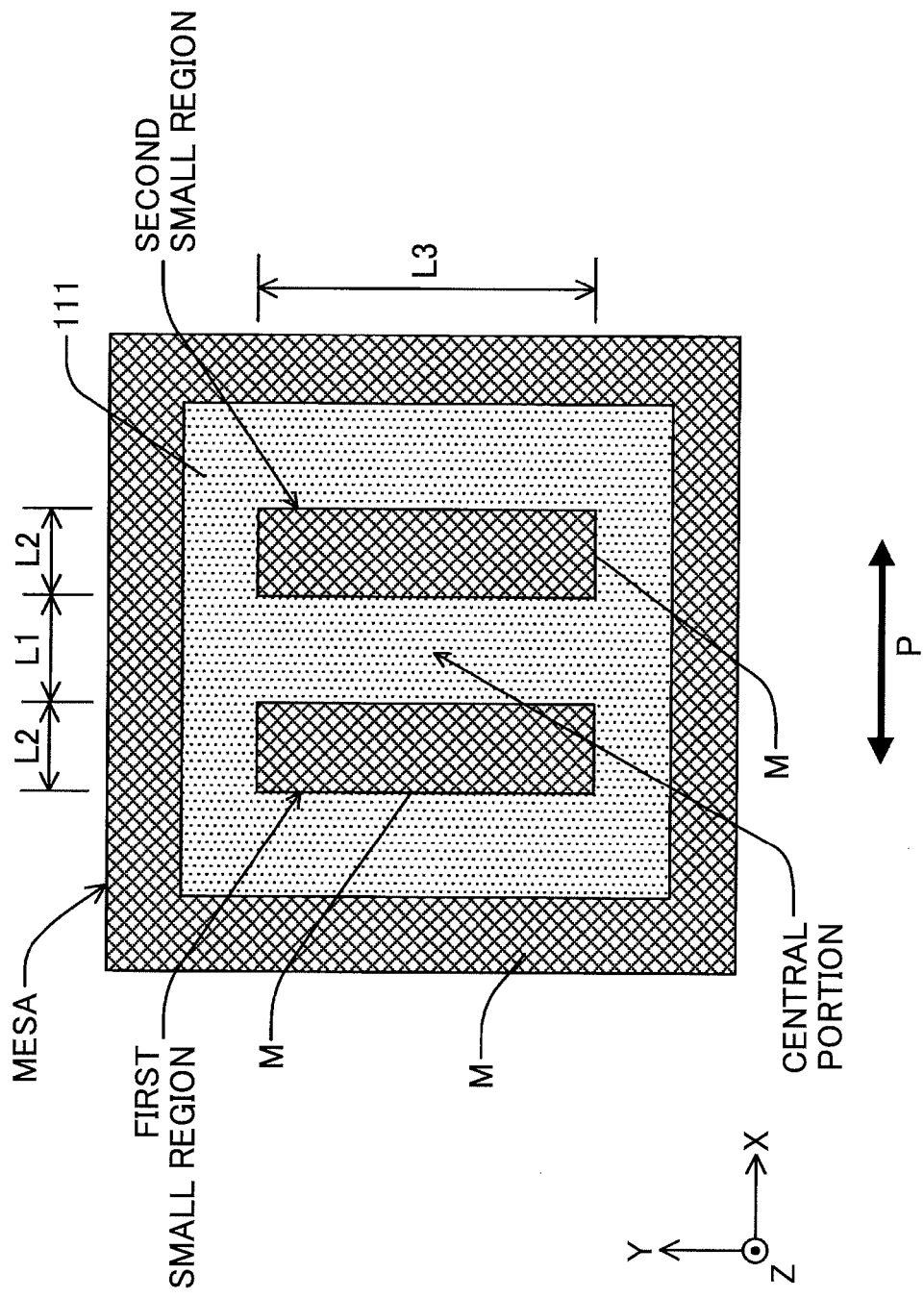

OPTICAL DEVICE, OPTICAL SCANNING APPARATUS AND IMAGE FORMING APPARATUS

CROSS-REFERENCE TO RELATED APPLICATIONS

This patent application is based upon and claims the benefit of priority of Japanese Patent Application No. 2010-099646 filed on Apr. 23, 2010 the entire contents of which are incorporated herein by reference.

BACKGROUND OF THE INVENTION

1. Field of the Invention

The present invention is generally directed to an optical device, an optical scanning apparatus and an image forming apparatus, and in particular to an optical device for emitting light, an optical scanning apparatus having the optical device and an image forming apparatus having the optical scanning apparatus.

2. Description of the Related Art

In recent years, vertical cavity surface emitting laser devices, which emit light in a direction perpendicular to the surface of the substrate, have attracted attention because of being less expensive, lower in power consumption, smaller in size and more suitable for two-dimensional devices and having higher performance compared to edge emitting semiconductor laser devices that emit light in a direction parallel to the substrate surface.

The fields of application of the surface emitting laser devices may include light sources for optical writing systems in printers (oscillation wavelength in the 780 nm band), light sources for writing in optical disk apparatuses (oscillation wavelength in the 780 or 850 nm band) and light sources for optical transmission systems, such as a LAN (Local Area Network), using an optical fiber (oscillation wavelength in the 1.3 or 1.5 µm band). Furthermore, the surface emitting laser devices are expected to be applicable as light sources for optical transmission between boards, within a board, between chips in a LSI (Large Scale Integrated circuit) and within a chip in a LSI.

In these fields of application, it is often the case that light emitted from a surface emitting laser device (hereinafter, also referred to as the "emitted light") is required to have (1) a round cross-sectional shape and (2) a constant polarization direction.

In order to make the cross-sectional shape of the emitted light round, it is necessary to suppress the oscillation of higher-order transverse modes. To do this, various approaches have been made (see, for example, Patent Document 1).

In addition, various approaches to control the polarization direction of the emitted light have been made (see, for example, Patent Document 2).

Furthermore, studies have been made in balancing the suppression of the oscillation of higher-order transverse modes and the control of the polarization direction (see, for example, Patent Documents 3 and 4).

In addition, it is sometimes the case that surface emitting laser devices have a change in the amount of emitted light due to a change in the ambient temperature or degradation of the surface emitting laser devices themselves. Accordingly, it is necessary to monitor the amount of emitted light in order to achieve stable optical scanning and form high-quality images.

As for optical scanning apparatuses using an edge emitting semiconductor laser device, APC (Auto Power Control) is carried out with monitoring the amount of backward emitted light. However, the backward emitted light does not occur in a surface emitting laser device due to its structure. Therefore, in optical scanning apparatuses using a surface emitting laser device, a portion of the beam of light emitted from the light source is received by a detector, such as a photodiode device, as a monitoring beam of light, and APC is carried out based on the reception result (see, for example, Patent Document 5).

[Patent Document 1] Japanese Patent Publication No. 3566902

[Patent Document 2] Japanese Patent Publication No. 3955925

[Patent Document 3] Japanese Laid-open Patent Application Publication No. 2007-201398

[Patent Document 4] Japanese Laid-open Patent Application Publication No. 2004-289033

[Patent Document 5] Japanese Laid-open Patent Application Publication No. H10-051067

However, a power monitoring system disclosed in Patent Document 5 leaves the problem that highly accurate monitoring of the light amount is difficult since the amount of light received by the monitor after being reflected by an optical element is small, which results in a low signal-to-noise ratio (S/N ratio).

SUMMARY OF THE INVENTION

Given these factors, the present invention has been made to solve or reduce one or more of the above-mentioned problems, and a first object of the present invention is to provide an optical device for emitting light in a stable manner with little variation in the amount of the light.

In addition, a second object of the present invention is to provide an optical scanning apparatus capable of highly accurate optical scanning.

Furthermore, a third object of the present invention is to provide an image forming apparatus for forming high-quality images.

One aspect of the present invention may be to provide an optical device including at least one surface emitting laser device having a transparent dielectric film for causing a central portion of a light emitting region to have a comparatively higher reflectivity than a peripheral portion of the light emitting region; a light receiving element disposed, with respect to a first direction, on one side in relation to the surface emitting laser device; and a transparent member disposed in a light path of light emitted from the surface emitting laser device and configured to reflect a portion of the light toward the light receiving element as monitoring light. The central portion has a shape anisotropy in which a width measured on a line extending in the first direction and passing through the center of the light emitting region is smaller than a width measured on a line extending in a second direction, which is perpendicular to the first direction, and passing through the center of the light emitting region.

Another aspect of the present invention is an optical scanning apparatus for emitting light onto a surface to be scanned. The optical scanning apparatus includes a light source having an optical device; a deflector configured to deflect light emitted from the light source; and a scanning optical system configured to focus the deflected light onto the surface to be scanned. The optical device includes at least one surface emitting laser device having a transparent dielectric film for causing a central portion of a light emitting region to have a comparatively higher reflectivity than a peripheral portion of the light emitting region; a light receiving element disposed, with respect to a first direction, on one side in relation to the surface emitting laser device; and a transparent member disposed in a light path of light emitted from the surface emitting laser device and configured to reflect a portion of the light toward the light receiving element as monitoring light, wherein the central portion has a shape anisotropy in which a width measured on a line extending in the first direction and passing through a center of the light emitting region is smaller than a width measured on a line extending in a second direction, which is perpendicular to the first direction, and passing through the center of the light emitting region.

Yet another aspect of the present invention is an image forming apparatus including at least one image carrier; and at least one optical scanning apparatus for emitting, onto the image carrier, light modulated based on image information. The optical scanning apparatus includes a light source having an optical device; a deflector configured to deflect light emitted from the light source; and a scanning optical system configured to focus the deflected light onto the image carrier. The optical device includes at least one surface emitting laser device having a transparent dielectric film for causing a central portion of a light emitting region to have a comparatively higher reflectivity than a peripheral portion of the light emitting region; a light receiving element disposed, with respect to a first direction, on one side in relation to the surface emitting laser device; and a transparent member disposed in a light path of light emitted from the surface emitting laser device and configured to reflect a portion of the light toward the light receiving element as monitoring light. The central portion has a shape anisotropy in which a width measured on a line extending in the first direction and passing through a center of the light emitting region is smaller than a width measured on a line extending in a second direction, which is perpendicular to the first direction, and passing through the center of the light emitting region.

Additional objects and advantages of the embodiments will be set forth in part in the description which follows, and in part may be obvious from the description, or may be learned by practice of the invention. The object and advantages of the invention may be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE DRAWINGS

FIGS. 10A and 10B are diagrams for illustrating the method for manufacturing the laser chip (surface emitting laser device) (part 2);

FIG. 11 is an enlarged view of a top surface of a mesa of FIG. 10B;

DETAILED DESCRIPTION OF THE PREFERRED EMBODIMENTS

Figure 1:
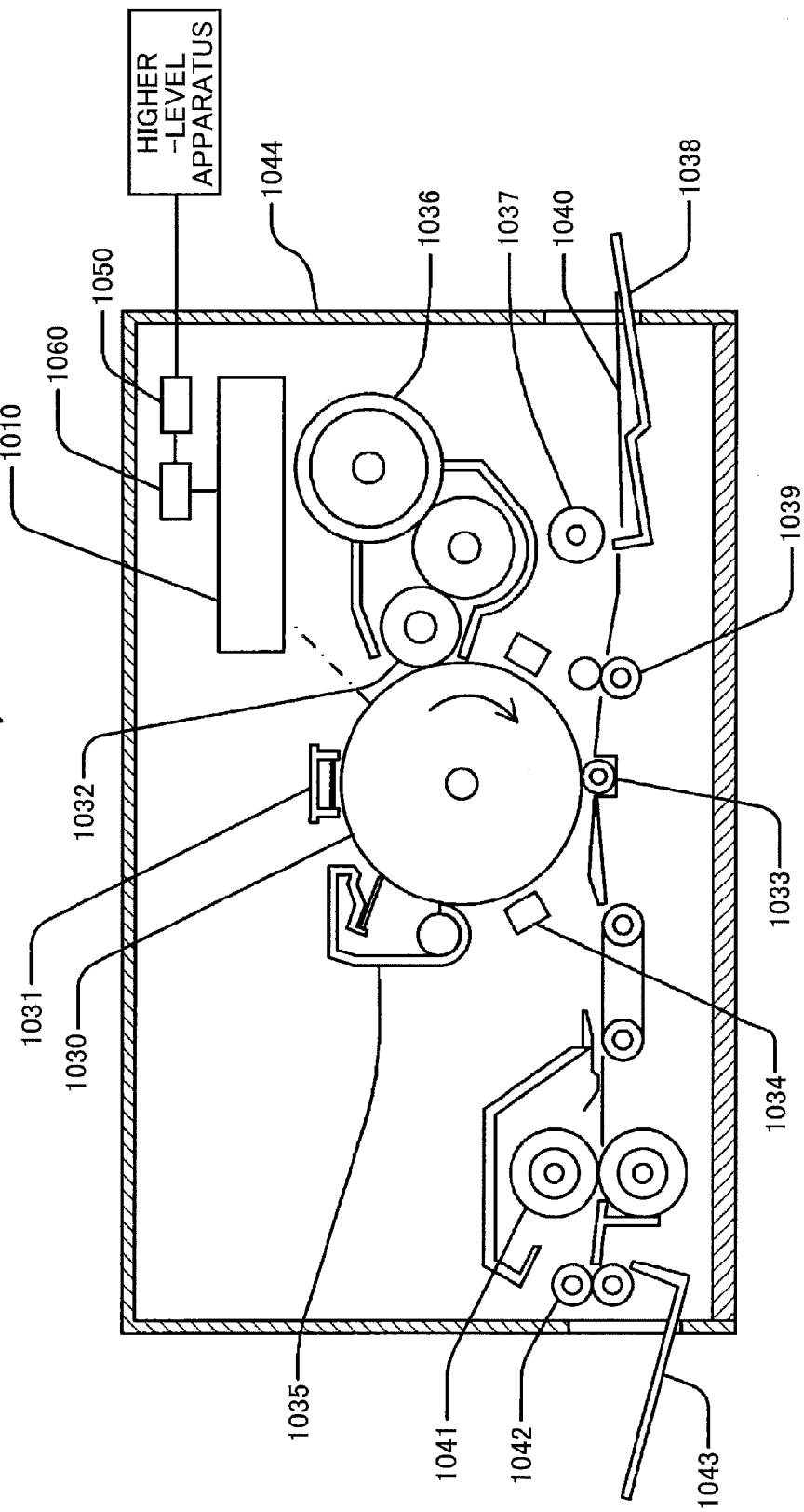
FIG. 1 is a diagram for illustrating a general structure of a laser printer according to an embodiment of the present invention.

An embodiment that describes the best mode for carrying out the present invention is explained next with reference to FIGS. 1 to 37. FIG. 1 shows a general structure of a laser printer 1000, which is an image forming apparatus according to the embodiment of the present invention.

The laser printer 1000 includes, for example, an optical scanning apparatus 1010, a photoreceptor drum 1030, a charger 1031, a developing roller 1032, a transfer charger 1033, a neutralizing unit 1034, a cleaning unit 1035, a toner cartridge 1036, a sheet feeding roller 1037, a sheet feed tray 1038, paired resist rollers 1039, fixing rollers 1041, sheet discharge rollers 1042, a catch tray 1043, a communication control unit 1050, and a printer control unit 1060 for exercising overall control over the aforementioned components. All of these components are disposed at predetermined positions in a printer cabinet 1044.

The communication control unit 1050 controls bidirectional communications with a higher-level apparatus (for example, a personal computer), which is connected to the laser printer 1000 via a network.

The printer control unit 1060 includes a CPU, a ROM for storing programs written in a code readable by the CPU and various types of data used when these programs are executed, and a RAM which is a working memory. The printer control unit 1060 controls each component in response to a request from the higher-level apparatus and transmits image information from the higher-level apparatus to the optical scanning apparatus 1010.

The photoreceptor drum 1030 has a cylindrical body, on the surface of which a photosensitive layer is formed. That is, the surface of the photoreceptor drum 1030 is a surface on which scanning is performed. The photoreceptor drum 1030 is designed to rotate in a direction indicated by the arrow in FIG. 1.

The charger 1031, the developing roller 1032, the transfer charger 1033, the neutralizing unit 1034 and the cleaning unit 1035 are disposed adjacent to the surface of the photoreceptor drum 1030. Specifically, these components are disposed along the rotational direction of the photoreceptor drum 1030 in the stated order.

The charger 1031 uniformly charges the surface of the photoreceptor drum 1030.

The optical scanning apparatus 1010 emits, onto the surface of the photoreceptor drum 1030 which is charged by the charger 1031, a beam of light modulated based on image information sent from the printer control unit 1060. Accordingly, a latent image corresponding to the image information is formed on the surface of the photoreceptor drum 1030. The latent image is then moved toward the developing roller 1032 as the photoreceptor drum 1030 rotates. Note that the structure of the optical scanning apparatus 1010 is described later.

The toner cartridge 1036 houses toner, which is to be supplied to the developing roller 1032.

The developing roller 1032 applies toner supplied from the toner cartridge 1036 to the latent image formed on the surface of the photoreceptor drum 1030 so as to develop the latent image into a visible image. Then, the visible image with toner (hereinafter, also referred to as the "toner image" for convenience) is moved toward the transfer charger 1033 as the photoreceptor drum 1030 rotates.

The sheet feed tray 1038 houses recording sheets 1040. The sheet feeding roller 1037 is provided near the sheet feed tray 1038. The sheet feeding roller 1037 takes out one recording sheet 1040 at a time from the sheet feed tray 1038 and conveys it to the paired resist rollers 1039. The resist rollers 1039 first hold the recording sheet 1040 taken out by the sheet feeding roller 1037, and then send the recording sheet 1040 out to the gap between the photoreceptor drum 1030 and the transfer charger 1033 in accordance with the rotation of the photoreceptor drum 1030.

A voltage having a polarity opposite to that of the toner on the surface of the photoreceptor drum 1030 is applied to the transfer charger 1033 in order to electrically attract the toner. By the voltage, the toner image on the photoreceptor drum 1030 is transferred to the recording sheet 1040. The recording sheet 1040 onto which the toner image has been transferred is sent to the fixing rollers 1041.

The fixing rollers 1041 apply heat and pressure to the recording sheet 1040, and thereby the toner is fixed onto the recording sheet 1040. Then, the recording sheet 1040 on which the toner has been fixed is sent to the catch tray 1043 via the sheet discharge rollers 1042. Multiple recording sheets 1040 subjected to such processing are sequentially stacked on the catch tray 1043.

The neutralizing unit 1034 renders the surface of the photoreceptor drum 1030 electrically neutral.

The cleaning unit 1035 removes toner remaining (residual toner) on the surface of the photoreceptor drum 1030. A part of the surface of the photoreceptor drum 1030 from which the residual toner has been removed returns to a position opposing the charger 1031.

Next is described the structure of the optical scanning apparatus 1010.

Figure 2:
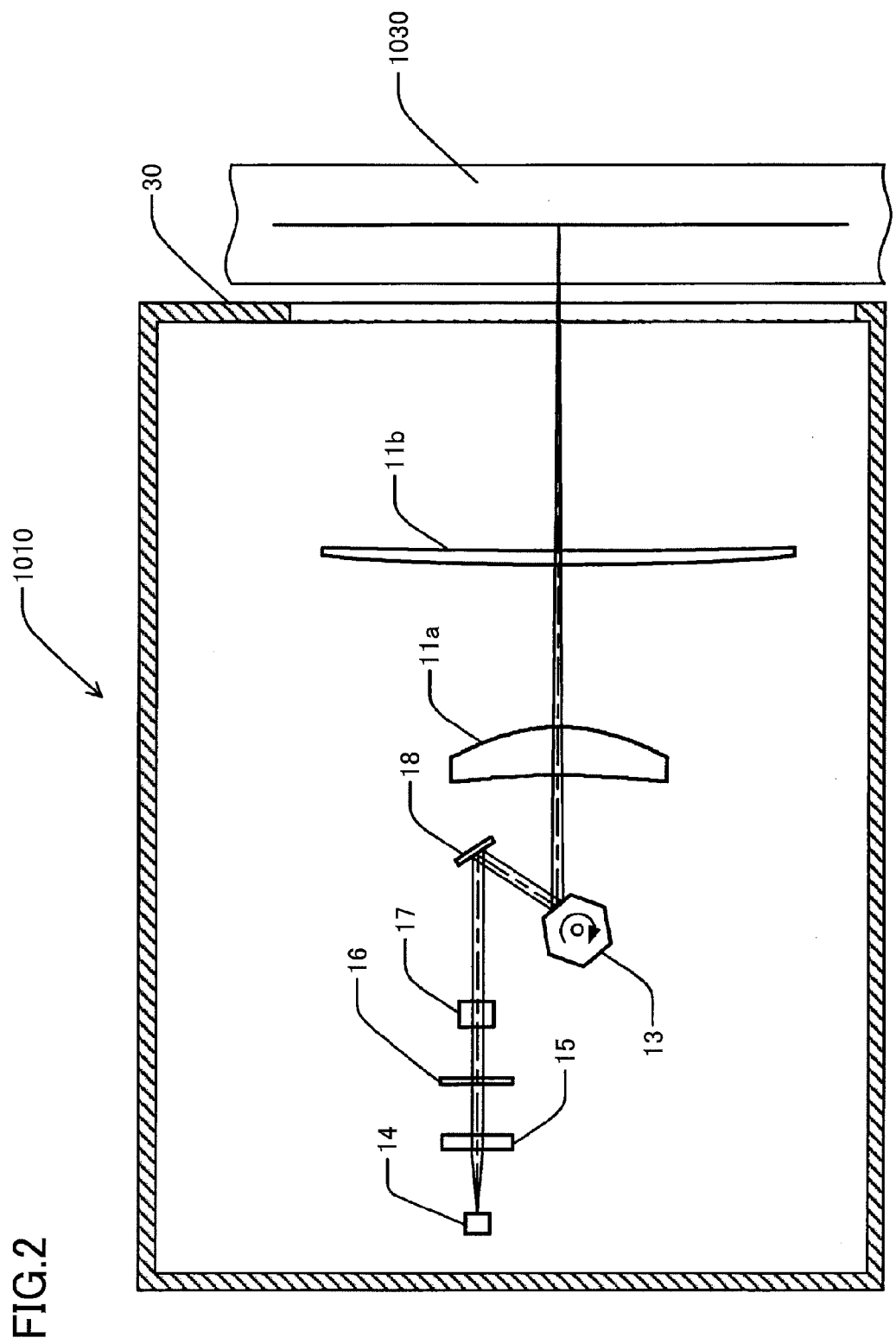
FIG. 2 is a schematic view illustrating an optical scanning apparatus of FIG. 1.

As an example shown in FIG. 2, the optical scanning apparatus 1010 includes a light source unit 14, a coupling lens 15, an aperture plate 16, a cylindrical lens 17, a reflector mirror 18, a polygon mirror 13, a deflector-side scanning lens 11a, an image plane-side scanning lens 11b, a scan controller (not shown) and the like. These components are disposed and fixed at predetermined positions in an optical housing 30.

Figure 3:
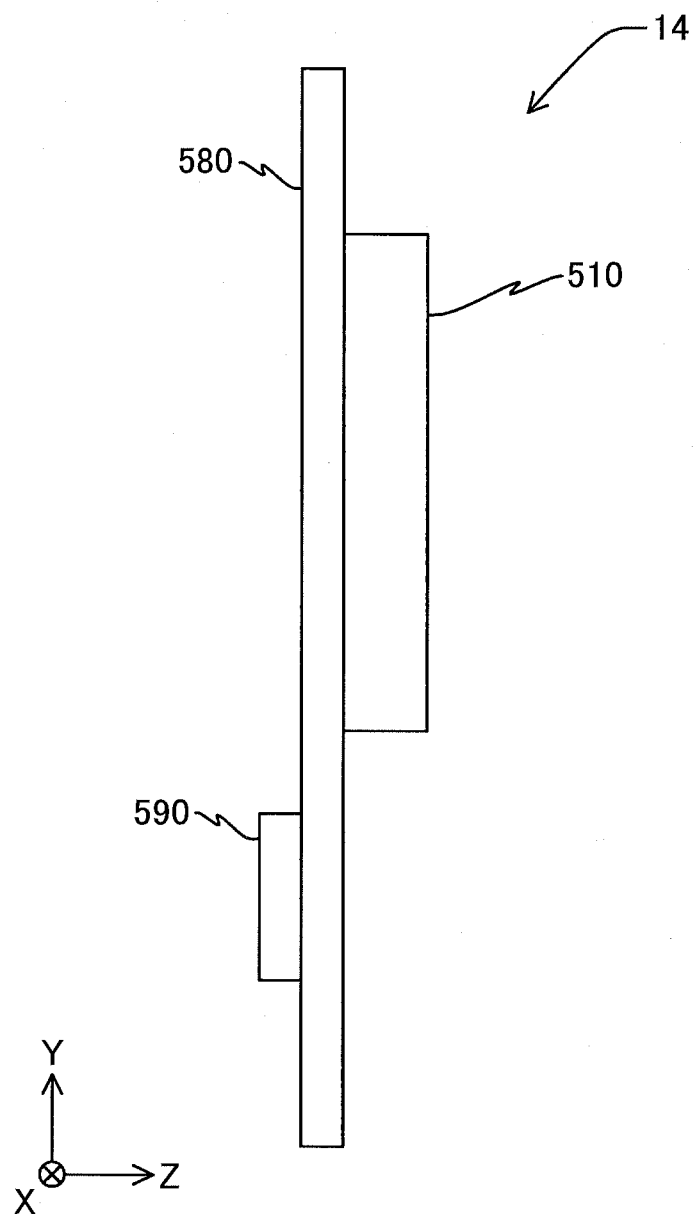
FIG. 3 is a diagram for illustrating a light source unit of FIG. 2.

The light source unit 14, as an example shown in FIG. 3, includes an optical device 510, a laser control unit 590 for drive-controlling the optical device 510, and a PCB (Printed Circuit Board) substrate 580 on which the optical device 510 and the laser control unit 590 are mounted.

In this specification, the direction of light emitted from the light source unit 14 is referred to as the Z direction, and two directions mutually orthogonal to each other in a plane perpendicular to the Z direction are referred to as the X and Y directions. Also note that a direction corresponding to the main scanning direction and a direction corresponding to the sub-scanning direction are hereinafter simply referred to as the "main scanning corresponding direction" and "sub-scanning corresponding direction", respectively.

Figure 4:
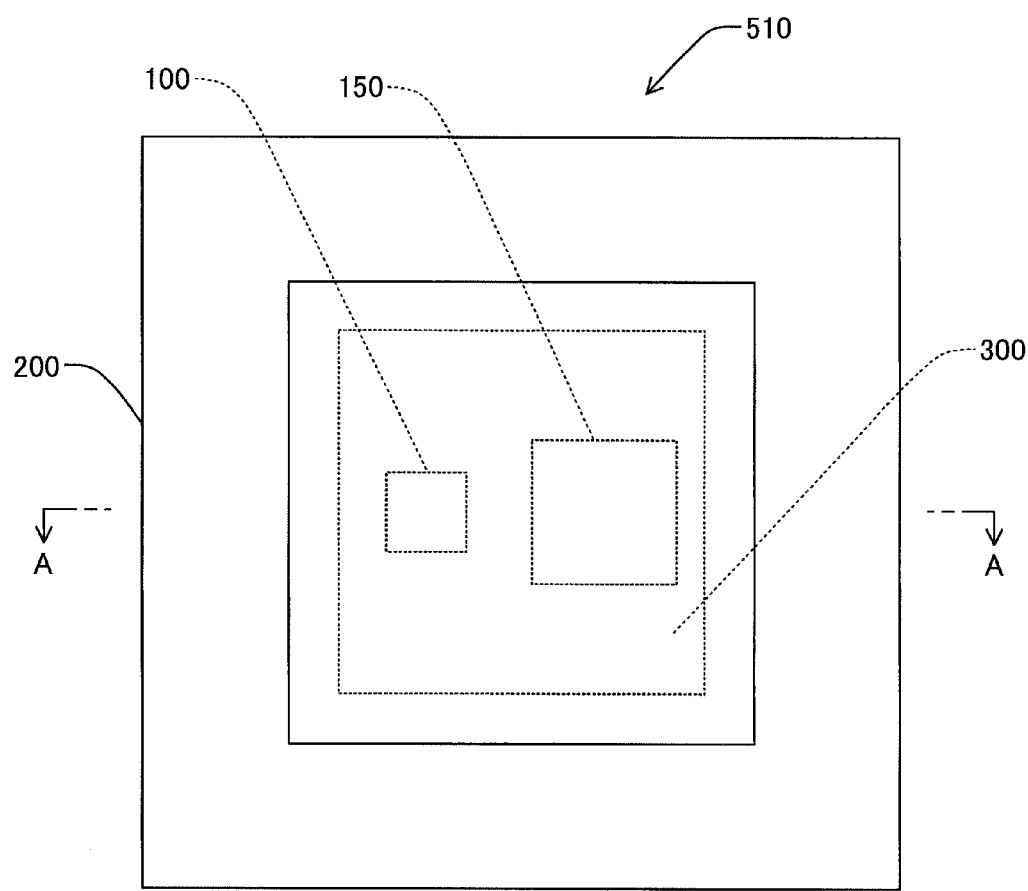
FIG. 4 is a diagram for illustrating an optical device included in the light source unit.
Figure 5:
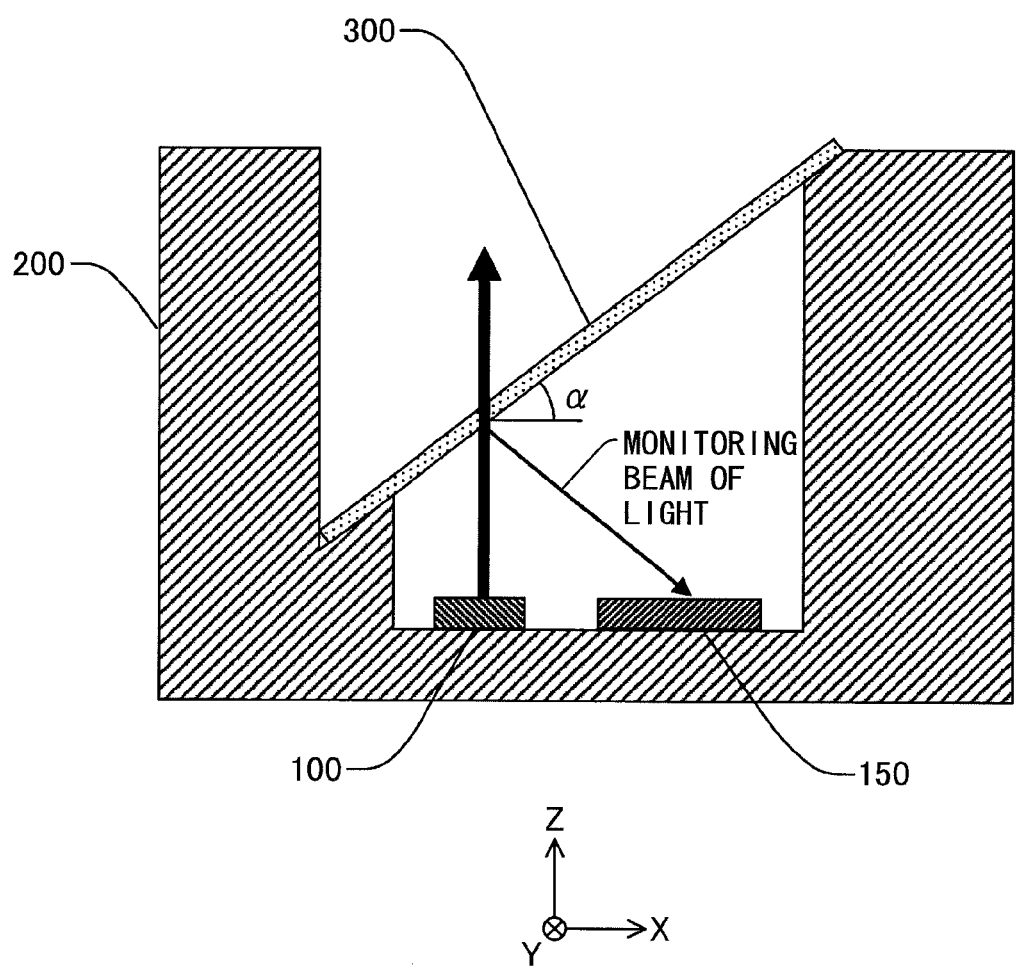
FIG. 5 is a cross-sectional diagram of FIG. 4 along line A-A.

The optical device 510, as an example shown in FIGS. 4 and 5, includes a laser chip 100, a light receiving element 150, a package member 200 holding the laser chip 100 and the light receiving element 150, a cover glass 300 and the like.

FIG. 4 is a plan view of the optical device 510, and FIG. 5 is a cross-sectional diagram of FIG. 4 along line A-A. In FIG. 5, a bonding wire connecting the laser chip 100 and the package member 200 and a bonding wire connecting the light receiving element 150 and the package member 200 are not shown to make the diagram easy to understand.

The package member 200 is a flat package called a multi-layered CLCC (Ceramic Leaded Chip Carrier) including ceramic and multiple metal wires. The multiple metal wires are respectively connected to multiple metal casters on lateral sides of the package and extend from the edges of the package member 200 toward the center.

In a +Z direction, the package member 200 has a region of space surrounded by walls.

At the bottom of the region of space, a metal film is provided. The metal film is also called a die attach area, and forms a common electrode.

The laser chip 100 and the light receiving element 150 are die-bonded to the surface of the metal film at the bottom of the region of space using a soldering material, such as AuSn. That is, the laser chip 100 and the light receiving element 150 are held on the bottom surface of the region surrounded by the walls.

More specifically, in the Y-axis direction, both the laser chip 100 and the light receiving element 150 are disposed in the center of the bottom. In the X-axis direction, the laser chip 100 and the light receiving element 150 are disposed on a −X-direction side and a +X-direction side, respectively, of the bottom surface. That is to say, the light receiving element 150 is disposed on a +X-direction side of the laser chip 100.

The cover glass 300 is a transparent and rectangular glass plate, and is disposed on the +Z-direction side of the laser chip 100 and the light receiving element 150 in such a manner as to enclose the region of space. This prevents dirt, dust and the like from coming in contact with the laser chip 100 and the light receiving element 150.

In addition, the cover glass 300 here is disposed in such a manner that the surface of the cover glass 300 is inclined (at an inclination angle $\alpha$), in an X-Z plane, counterclockwise with respect to the X-axis direction. Herewith, a portion of the beam of light emitted from the laser chip 100 is reflected by the surface of the cover glass 300 and enters the light receiving element 150.

The light receiving element 150 outputs a signal according to the amount of light received (photoelectric conversion signal) to the laser control unit 590.

Note that the beam of light emitted from the laser chip 100 and then passing through the cover glass 300 is the beam of light emitted from the optical device 510, i.e., the beam of light emitted from the light source unit 14.

Referring back to FIG. 2, the coupling lens 15 converts the beam of light emitted from the light source unit 14 into substantially parallel light.

The aperture plate 16 has an aperture and defines the beam diameter of the beam of light passing through the coupling lens 15.

The cylindrical lens 17 converts the beam of light having passed through the aperture of the aperture plate 16 so that the beam of light forms, via the reflector mirror 18, an image in the sub-scanning corresponding direction near the deflecting reflection surfaces of the polygon mirror 13.

An optical system disposed in the light path between the optical device 510 and the polygon mirror 13 may be referred to as a pre-deflector optical system. In the present embodiment, the pre-deflector optical system includes the coupling lens 15, the aperture plate 16, the cylindrical lens 17 and the reflector mirror 18.

The polygon mirror 13 is a short six-faceted mirror, and has six deflecting reflection surfaces along its sides. The polygon mirror 13 deflects the beam of light reflected by the reflector mirror 18 as it rotates around an axis parallel to the sub-scanning corresponding direction at a uniform velocity.

The deflector-side scanning lens 11a is disposed in the light path of the beam of light deflected by the polygon mirror 13.

The image plane-side scanning lens 11b is disposed in the light path of the beam of light having passed through the deflector-side scanning lens 11a. The beam of light having passed through the image plane-side scanning lens 11b is projected on the surface of the photoreceptor drum 1030, whereby an optical spot is formed. The optical spot shifts in the longitudinal direction of the photoreceptor drum 1030 as the polygon mirror 13 rotates. That is, the optical spot scans across the photoreceptor drum 1030. The direction in which the optical spot moves is the "main scanning direction". On the other hand, the rotational direction of the photoreceptor drum 1030 is the "sub-scanning direction".

An optical system disposed in the light path between the polygon mirror 13 and the photoreceptor drum 1030 may be referred to as a scanning optical system. In the present embodiment, the scanning optical system includes the deflector-side scanning lens 11a and the image plane-side scanning lens 11b. Note that at least one light-path bending mirror may be disposed in at least one of the light path between the deflector-side scanning lens 11a and the image plane-side scanning lens 11b and the light path between the image plane-side scanning lens 11b and the photoreceptor drum 1030.

Figure 6A:
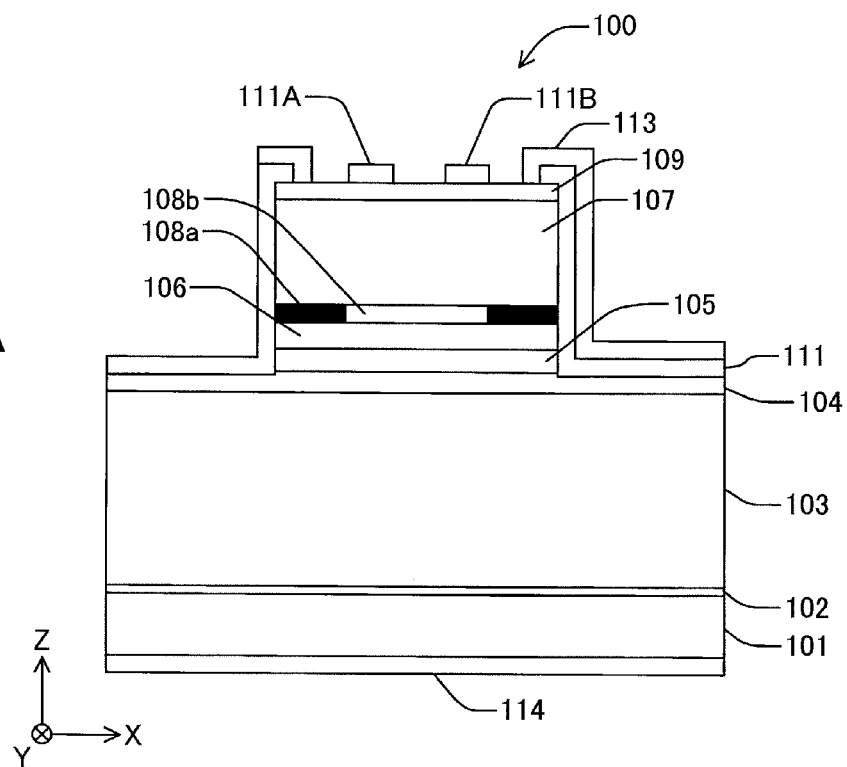
FIGS. 6A and 6B are diagrams for illustrating a laser chip (surface emitting laser device) included in the optical device.
Figure 6B:
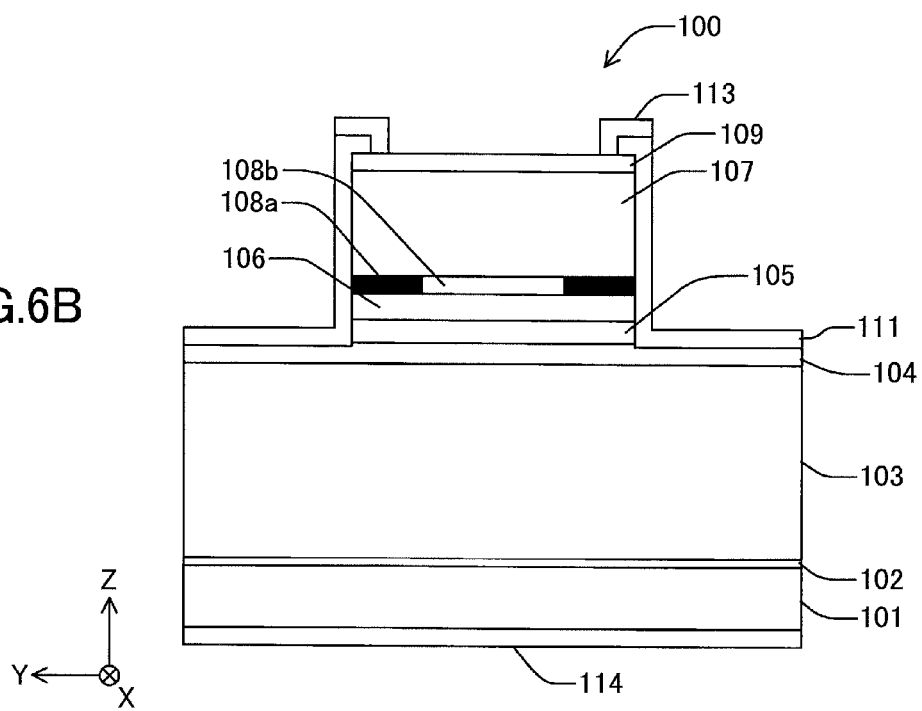

The laser chip 100 is a surface emitting laser device having an oscillation wavelength of 780 nm band, and includes, as an example shown in FIGS. 6A and 6B, a substrate 101, a buffer layer 102, a lower semiconductor DBR (Distribution Bragg Reflector) 103, a lower spacer layer 104, an active layer 105, an upper spacer layer 106, an upper semiconductor DBR 107, a contact layer 109 and the like. Note that FIGS. 6A and 6B show cross-sectional views of the laser chip 100 in planes parallel to the X-Z plane and the Y-Z plane, respectively.

Figure 7A:
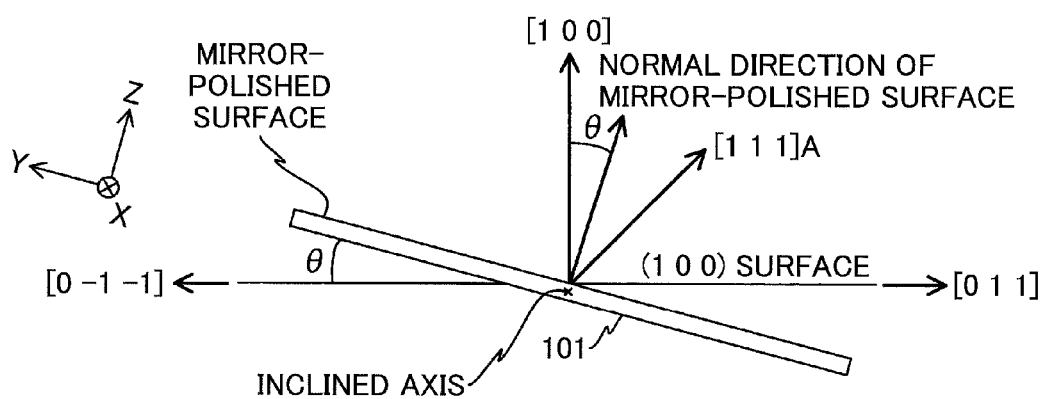
FIGS. 7A and 7B are diagrams for illustrating a substrate of the laser chip (surface emitting laser device)
Figure 7B:
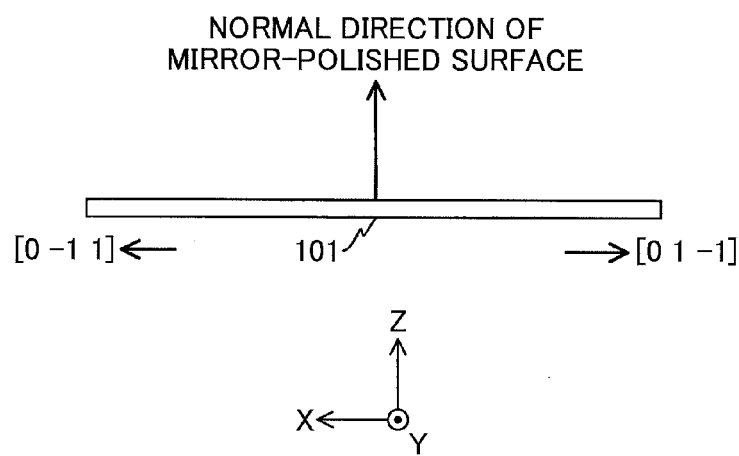

The substrate 101 included in the vertical cavity surface emitting laser device 100 has a mirror polished surface. The substrate 101 is an n-GaAs monocrystalline substrate in which the normal direction of the mirror polished surface (principal surface) is inclined by 15 degrees ($\theta=15$ degrees) from a crystal orientation [1 0 0] toward a crystal orientation [1 1 1]A, as shown in FIG. 7A. That is to say, the substrate 101 is an inclined substrate. In this embodiment, the substrate 101 is disposed in such a manner that a crystal orientation [0 −1 1] is aligned in the +X direction and a crystal orientation [0 1 −1] is aligned in the −X direction, as shown in FIG. 7B.

In addition, it is here considered that using the inclined substrate for the substrate 101 has an effect of stabilizing the polarization direction in the X-axis direction.

The buffer layer 102 is an n-GaAs layer laid on a +Z-direction surface of the substrate 101.

The lower semiconductor DBR 103 is laid over a +Z-direction surface of the buffer layer 102, and includes 40.5 pairs of an n-AlAs low refractive index layer 103a and an n-$Al_{0.3}Ga_{0.7}$As high refractive index layer 103b. In order to reduce electrical resistance, compositionally graded layers having a thickness of 20 nm are provided between the neighboring refractive index layers (see FIG. 8). In the compositionally graded layers, the composition gradually changes from one to another. It is designed that each of the refractive index layers has an optical thickness of $\lambda/4$ (where $\lambda$ is an oscillation wavelength) by including ½ the thickness of its neighboring compositionally graded layers. When the optical thickness is $\lambda/4$, an actual thickness D of the layer is $\lambda/4n$ (where n is a refractive index of the material of the layer).

The lower spacer layer 104, which is a non-doped $(Al_{0.1}Ga_{0.9})_{0.5}In_{0.5}P$ layer, is laid on a +Z-direction surface of the lower semiconductor DBR 103.

The active layer 105 is laid on a +Z-direction surface of the lower spacer layer 104. The active layer 105 is a threefold quantum well active layer including three quantum well layers 105a and four barrier layers 105b (see FIG. 8). Each of the quantum well layers 105a is made of GaInAsP, which is a composition inducing a compression strain of 0.7%, and has a band gap wavelength of about 780 nm. Each of the barrier layers 105b is made of GaInP, which is a composition inducing a tensile strain of 0.6%.

The upper spacer layer 106, which is a non-doped $(Al_{0.1}Ga_{0.9})_{0.5}In_{0.5}P$ layer, is laid on a +Z-direction surface of the active layer 105.

Figure 8:
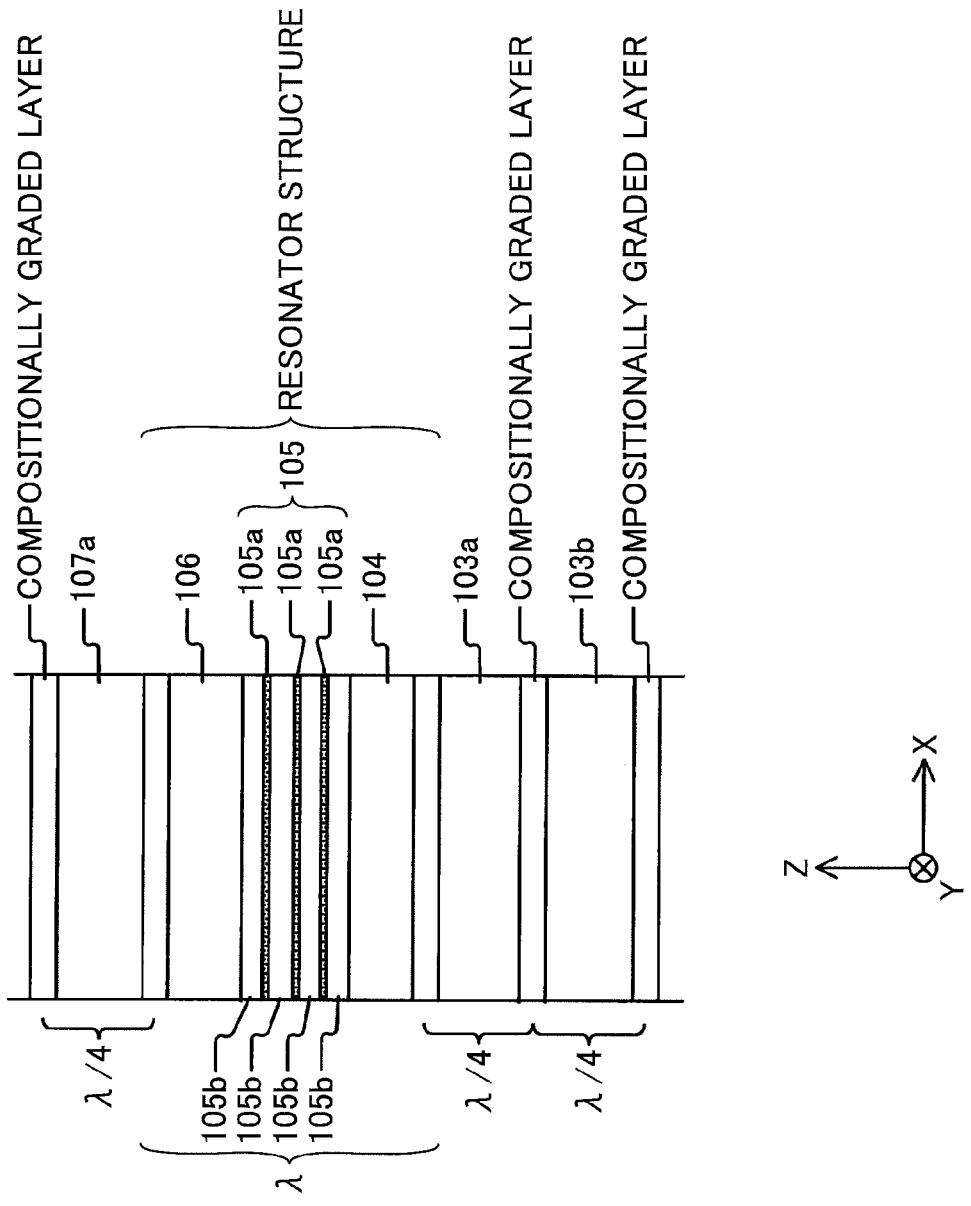
FIG. 8 is an enlarged view of an active layer and its vicinity.

A section including the lower spacer layer 104, the active layer 105 and the upper spacer layer 106 is referred to as a resonator structure, which is designed to have an optical thickness of $\lambda$ (see FIG. 8). Note that the active layer 105 is provided in the center of the resonator structure, which corresponds to an antinode of the standing wave of the electric field, in order to achieve a high stimulated emission rate.

The upper semiconductor DBR 107 is laid on a +Z-direction surface of the upper spacer layer 106, and includes 25 pairs of a $p-Al_{0.9}Ga_{0.1}As$ low refractive index layer and a $p-Al_{0.3}Ga_{0.7}As$ high refractive index layer.

Between the neighboring refractive index layers in the upper semiconductor DBR 107, compositionally graded layers in which the composition gradually changes from one to another are provided in order to reduce electrical resistance. It is designed that each of the refractive index layers has an optical thickness of $\lambda/4$ by including ½ the thickness of its neighboring compositionally graded layers.

In one of the low refractive index layers of the upper semiconductor DBR 107, a p-AlAs selective oxidation layer 108 having a thickness of 30 nm is inserted. The selective oxidation layer 108 is provided, within the low refractive index layer of the third pair from the active layer 105, at a position corresponding to nodes of the standing wave of the electric field.

The contact layer 109 is a p-GaAs layer laid on a +Z-direction surface of the upper semiconductor DBR 107.

A resultant structure in which multiple semiconductor layers are laid over the substrate 101 is hereinafter also referred to as the "laminated body" for the sake of convenience.

Next is a brief description of a method for manufacturing the laser chip 100. Assume here that a desired polarization direction (hereinafter, referred to as the "desired polarization direction P") is the X-axis direction.

Figure 9A:
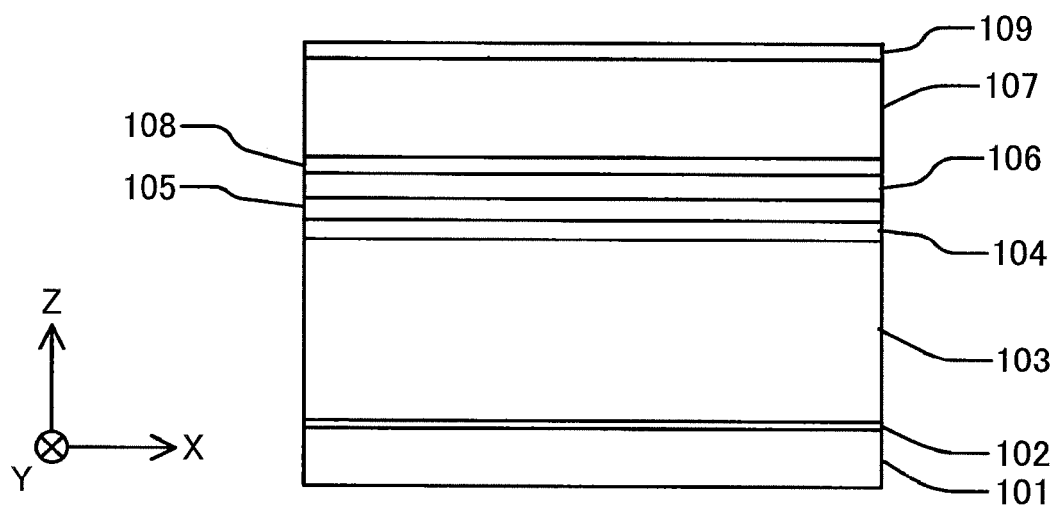
FIGS. 9A to 9C are diagrams for illustrating a method for manufacturing the laser chip (surface emitting laser device) (part 1)

(1) The above-described laminated body is created by a crystal growth method, such as metal-organic chemical vapor deposition (MOCVD method) or molecular beam epitaxy (MBE method) (see FIG. 9A).

In this step, trimethylaluminium (TMA), trimethyl gallium (TMG) and trimethyl indium (TMI) are used as the group-III materials, and phosphine ($PH_3$) and arsine ($AsH_3$) are used as the group-V materials. In addition, carbon tetrabromide ($CBr_4$) and dimethylzinc (DMZn) are used as p-type dopant materials, and hydrogen selenide ($H_2Se$) is used as an n-type dopant material.

(2) A square resist pattern, each side of which is 25 μm, is formed on the surface of the laminated body.

(3) Using the square resist pattern as a photomask, a square columnar mesa structure (simply referred to below as the "mesa" for the sake of convenience) is formed by ECR etching using $Cl_2$ gas. The etching bottom is positioned in the lower spacer layer 104.

Figure 9B:
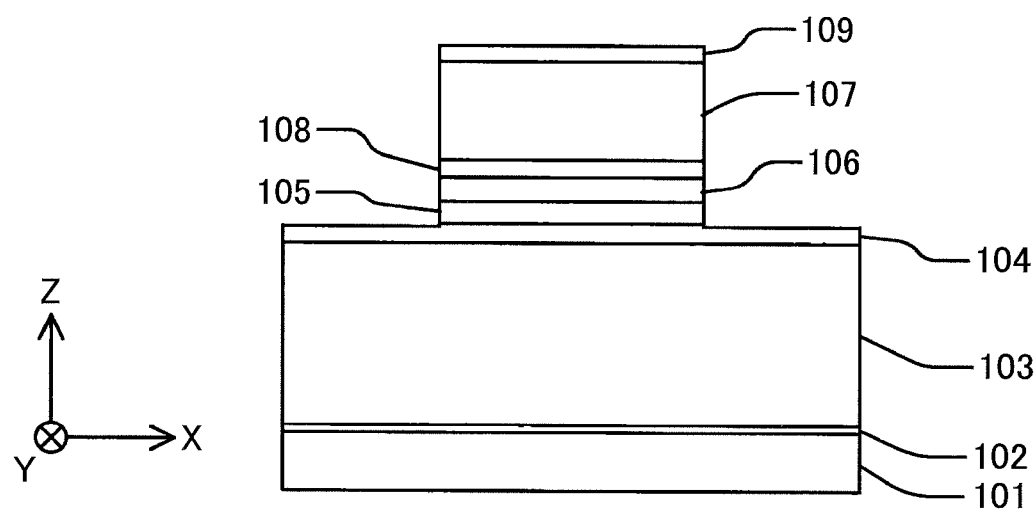
Figure 9C:
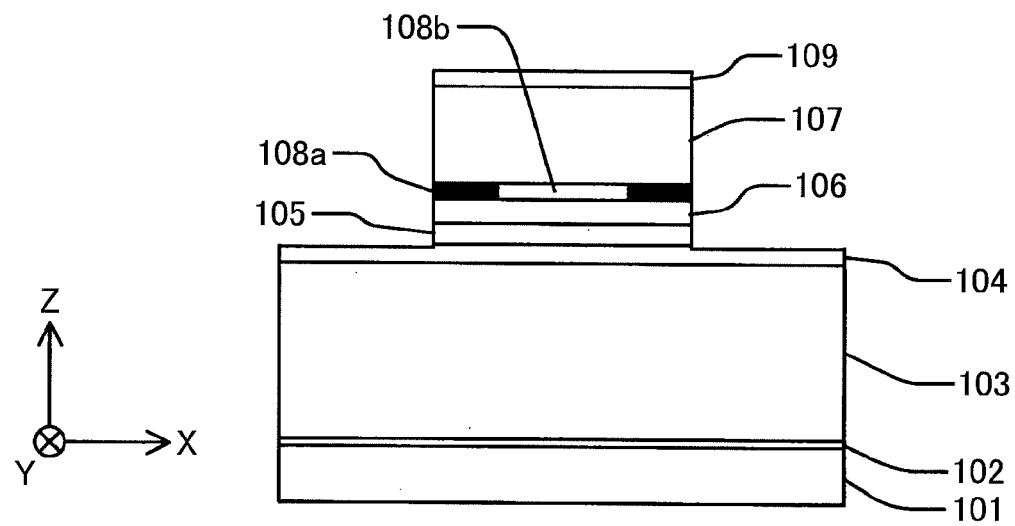
Figure 10B:
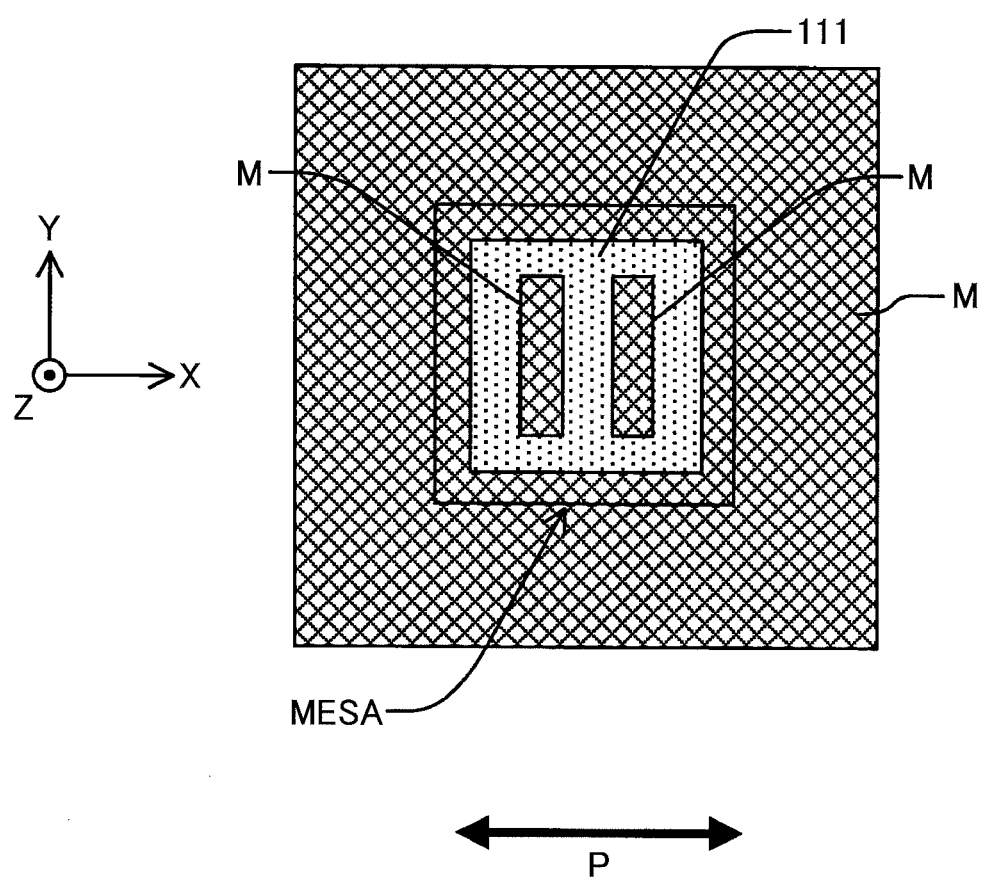

(4) The photomask is removed (see FIG. 9B).

(5) The laminated body is heat-treated in water vapor. Herewith, Al (aluminum) in the selective oxidation layer 108 is selectively oxidized from the periphery of the mesa. Accordingly, an unoxidized region 108b which is surrounded by an Al oxidized region 108a is left in the center of the mesa (see FIG. 9C). That is, an oxidized current confinement structure is formed, in which a pathway of the current for driving a light emitting unit is limited to the center of the mesa. The unoxidized region 108b functions as a current passage region. In this manner, the current passage region, which is substantially square in shape with a width of, for example, about 4 to 6 μm, is formed.

(6) A protective layer 111 made of SiN is formed by chemical vapor deposition (CVD method) (see FIG. 10A). Here, the protective layer 111 is designed to have an optical thickness of $\lambda/4$. More specifically, the actual thickness ($=\lambda/4n$) of the protective layer 111 is set to about 105 nm since the refractive index n of SiN is 1.86 and the oscillation wavelength $\lambda$ is 780 nm.

(7) An etching mask (referred to as the mask M) is created to be used for forming an aperture for a p-electrode contact on the top of the mesa. The top of the mesa is a light emitting surface from which a laser light is emitted. In this step, the mask M is created to prevent, from being etched, the region surrounding the mesa, the periphery of the top surface of the mesa and two small regions (first and second small regions) having the central portion of the top surface of the mesa between them and opposing each other in a direction parallel to the desired polarization direction P (the X-axis direction in this case), as an example shown in FIG. 10B and FIG. 11, which is an enlarged view of the mesa in FIG. 10B. Specifically, the reference symbols L1, L2 and L3 in FIG. 11 are 5 μm, 2 μm and 8 μm, respectively.

(8) The protective layer 111 is etched using BHF to form the aperture for the p-electrode contact.

Figure 12A:
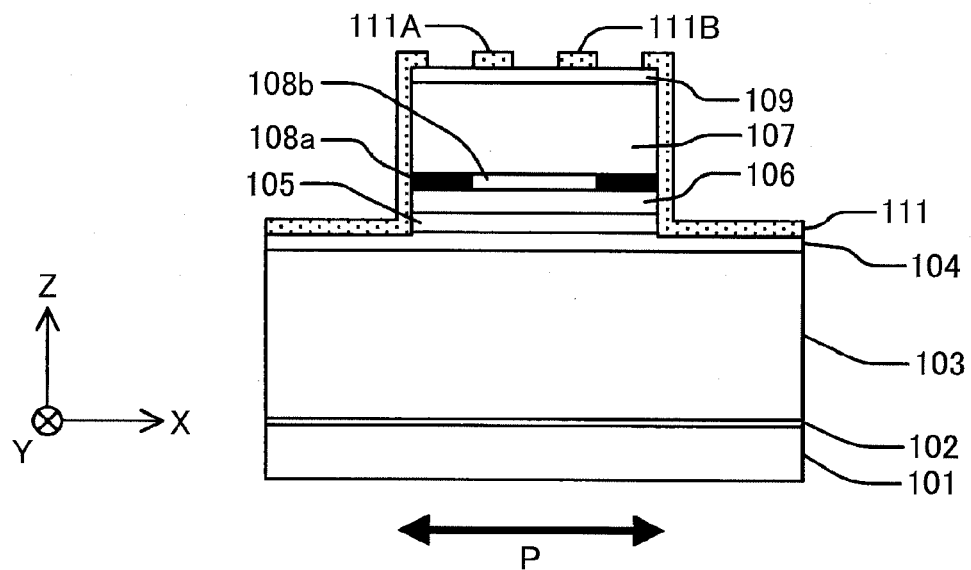
FIGS. 12A to 12C are diagrams for illustrating the method for manufacturing the laser chip (surface emitting laser device) (part 3)
Figure 12B:
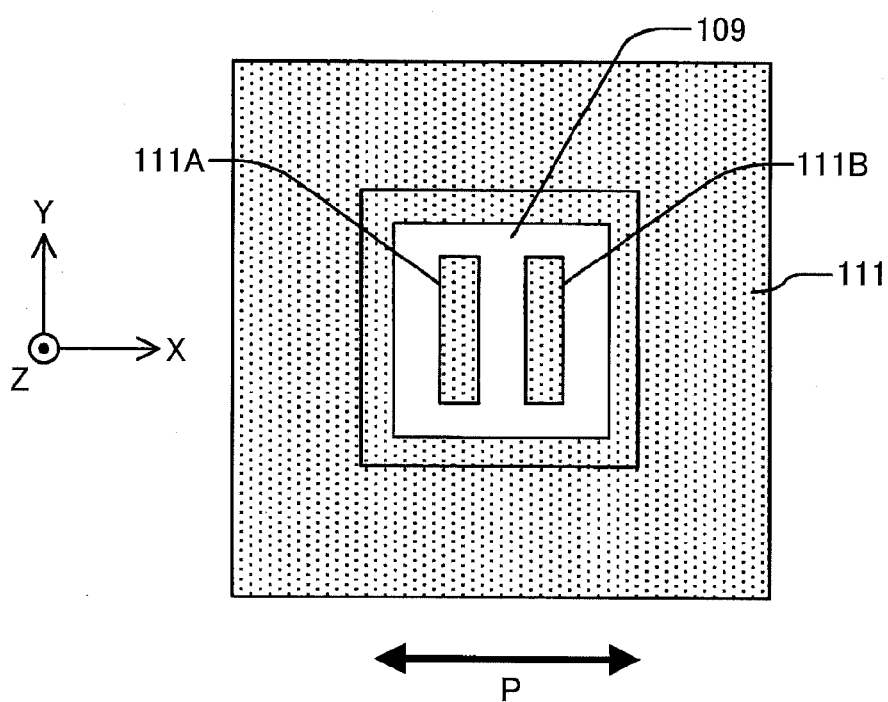

(9) The mask M is removed (see FIGS. 12A and 12B). Note that the protective layer 111 remaining in the first small region is referred to as the "transparent layer 111A" and the protective layer 111 remaining in the second small region is referred to as the "transparent layer 111B" for the sake of convenience.

When etching is performed on the protective layer 111, the mask M is also etched from the lateral direction (i.e., a direction perpendicular to the Z-axis direction). As a result, the configuration of the mask M becomes small as the etching progresses. Therefore, the lateral sides of the transparent layers 111A and 111B become sloped in the Z-axis direction.

(10) A square resist pattern, each side of which is 10 μm, is formed, on the top of the mesa, at a region to be a light emitting unit (hereinafter, referred to as the "light emitting region"), and p-electrode materials are then deposited on the top of the mesa by vapor-deposition. As the p-electrode materials, a multilayer film made of Cr/AuZn/Au or Ti/Pt/Au is used.

Figure 12C:
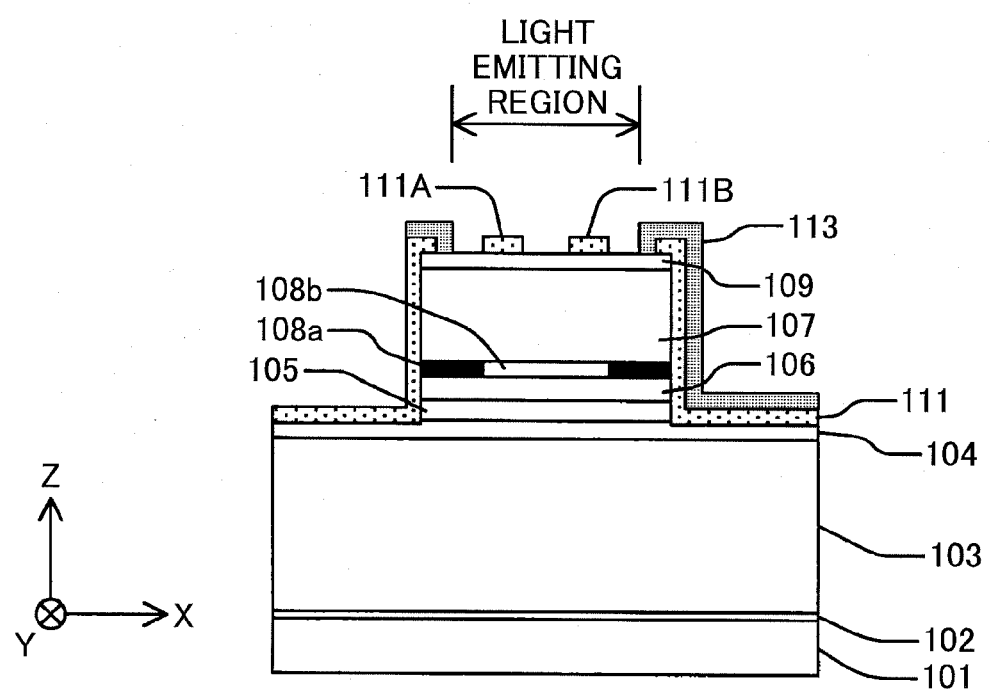
Figure 13:
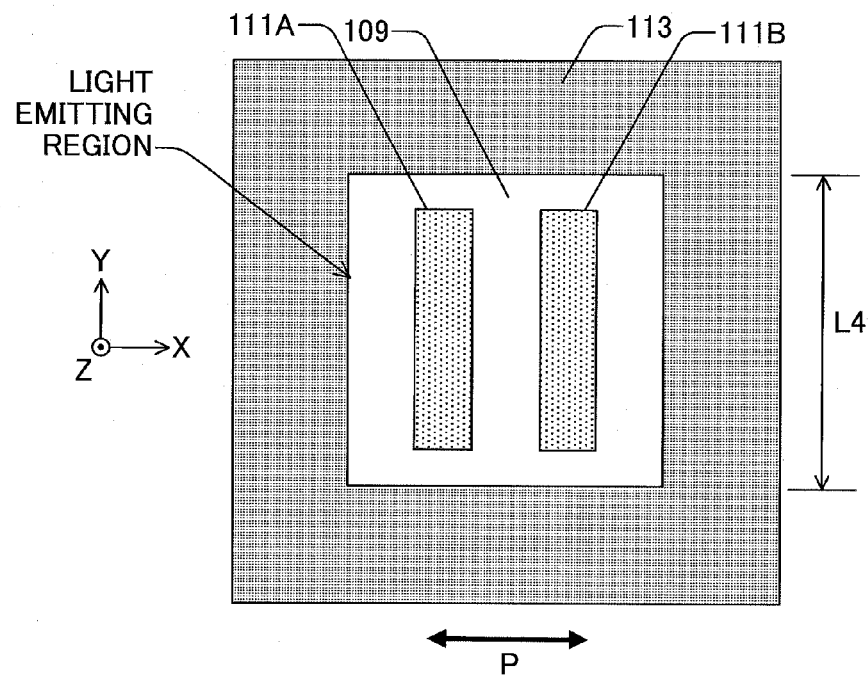
FIG. 13 is an enlarged view of the top surface of a mesa of FIG. 12C.

(11) The p-electrode materials deposited over the light emitting region are lifted off, whereby a p-electrode 113 is formed (see FIG. 12C). The light emitting region is a region surrounded by the p-electrode 113. Note that FIG. 13 is an enlarged view of the mesa in FIG. 12C. The light emitting region has a shape of a square with L4 per side (10 μm in this case). According to the present embodiment, the transparent layers 111A and 111B are present, as transparent SiN dielectric films having an optical thickness of $\lambda/4$, in the two small regions (the first and second small regions) within the light emitting region. Herewith, the two small regions have lower reflectivity than that of the central portion of the light emitting region. Therefore, the region between the two small regions has comparatively higher reflectivity. Note that the transparent dielectric films formed in the light emitting region are also called the "mode filter".

Figure 14:
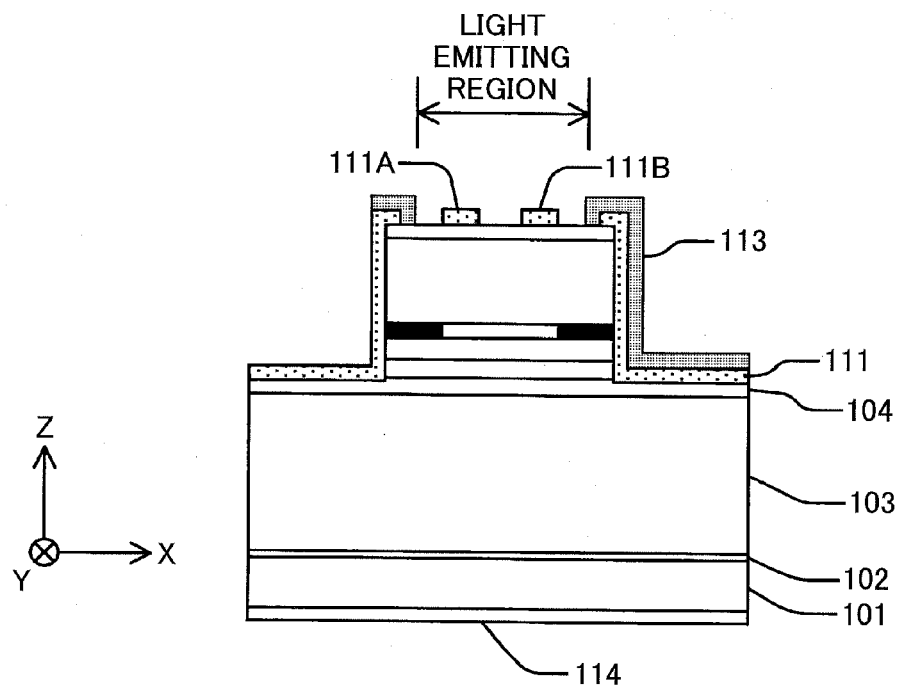
FIG. 14 is a diagram for illustrating the method for manufacturing the laser chip (surface emitting laser device) (part 4)
Figure 15A:
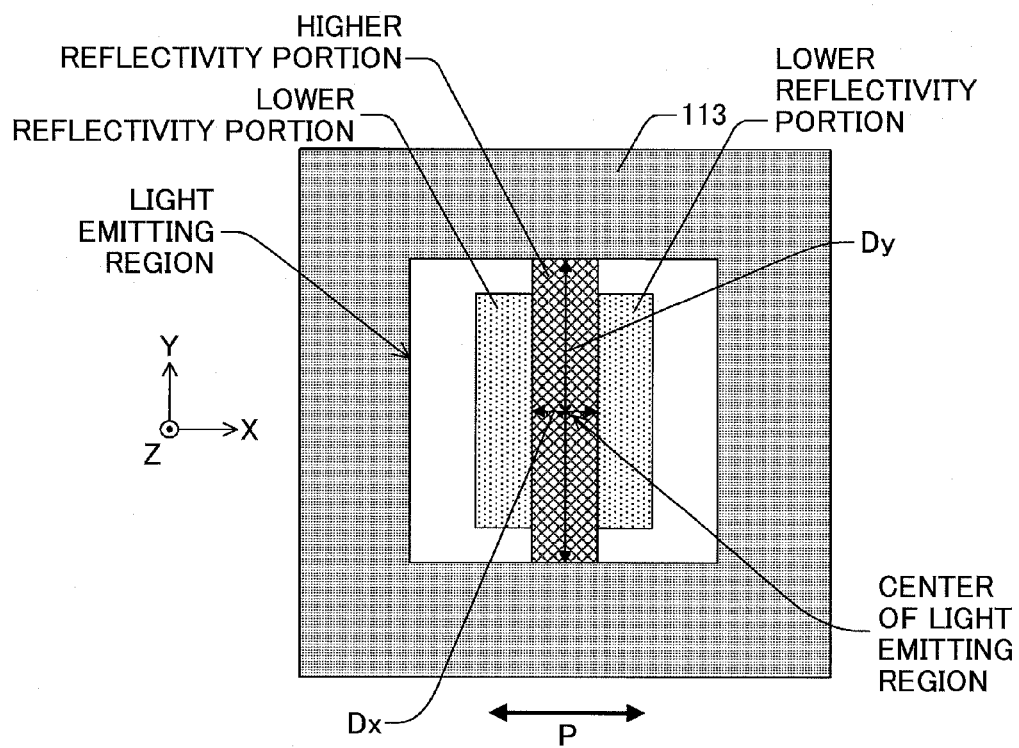
FIGS. 15A and 15B are diagrams for illustrating a relationship between inclination of a cover glass and a mode filter.
Figure 15B:
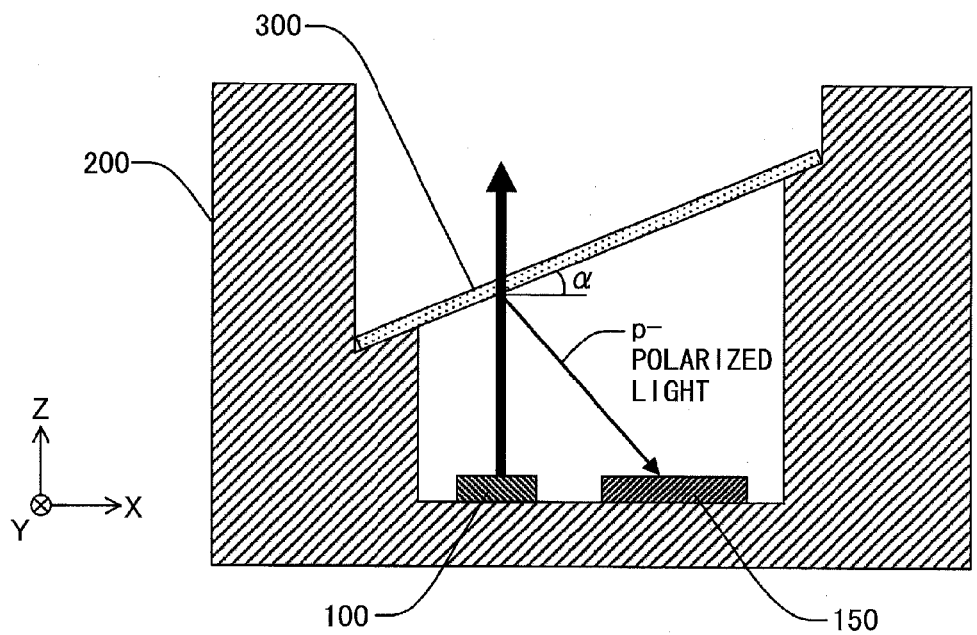

(12) The back side of the substrate 101 is polished so that the substrate 101 has a predetermined thickness (about 100 μm, for example), and then, an n-electrode 114 is formed (see FIG. 14). The n-electrode 114 is a multilayer film made of AuGe/Ni/Au.

(13) The p-electrode 113 and the n-electrode 114 are ohmically connected by annealing. Accordingly, the mesa becomes a light emitting unit.

(14) The laminated body is cut into chips.

(15) After going through various post-processing, the chips become the laser chips 100.

As described above, the laser chip 100 has transparent dielectric films causing the central portion of the light emitting region to have comparatively higher reflectivity than its peripheral portion. The central portion having comparatively higher reflectivity in the light emitting region has a shape anisotropy where a width Dx measured on a line extending in a direction parallel to the X-axis and passing through the center of the light emitting region is smaller than a width Dy measured on a line extending in a direction parallel to the Y-axis and passing though the center of the light emitting region (see FIG. 15A). For this reason, the polarization direction of the beam of light emitted from the laser chip 100 is controlled in the P direction.

The light receiving element 150 is disposed on the +X-direction side of the laser chip 100. Accordingly, with respect to the beam of light reflected by the cover glass 300 and then entering the light receiving element 150 (i.e., the monitoring beam of light), the vibration direction of the electric field vector of the light is included in the incident surface of the light receiving element 150. That is, the monitoring beam of light is received by the light receiving element 150 as a p-polarized light (see FIG. 15B).

Next are described the configuration of the mode filter and the polarization stability.

In general, a light output in the fundamental transverse mode tends to be maximal near the center of the light emitting region and decrease toward the peripheral portion. On the other hand, a light output in some higher-order transverse modes becomes large in the peripheral portion of the light emitting region and decreases toward the center.

According to the present embodiment, the reflectivities of the two small regions (the first and second small regions) in the peripheral portion of the light emitting region are set lower than that of the central portion. This enables a decrease in the reflectivity of the higher-order transverse modes without causing a decrease in the reflectivity of the fundamental transverse mode. That is, it is possible to suppress the oscillation of higher-order transverse modes without decreasing the light output in the fundamental transverse mode.

Figure 16:
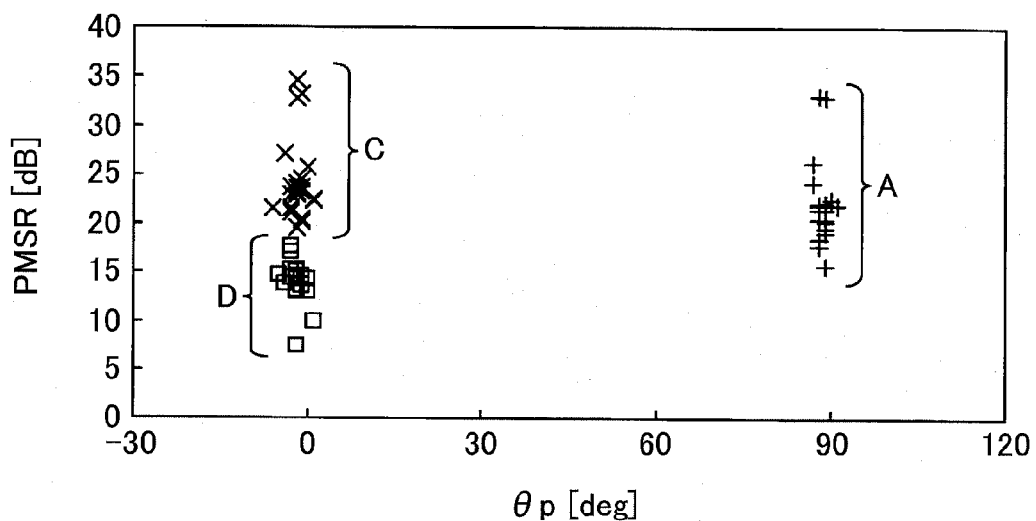
FIG. 16 is a diagram for illustrating a relationship between a polarization mode suppression rate PMSR and a polarization angle $\theta p$.

Regarding the laser chip 100, the relationship between a polarization mode suppression ratio PMSR and a polarization angle θp has been studied. The results are shown in FIG. 16 with a comparative example. Note that the polarization mode suppression ratio is a ratio of the light intensity in a desired polarization direction to the light intensity in a direction perpendicular to the desired polarization direction, and it is considered that a copying machine or the like needs a polarization mode suppression ratio of about 20 dB. Here, the Y-axis direction is a polarization angle θp of 0°, and the X-axis direction is a polarization angle θp of 90°.

Figure 17:
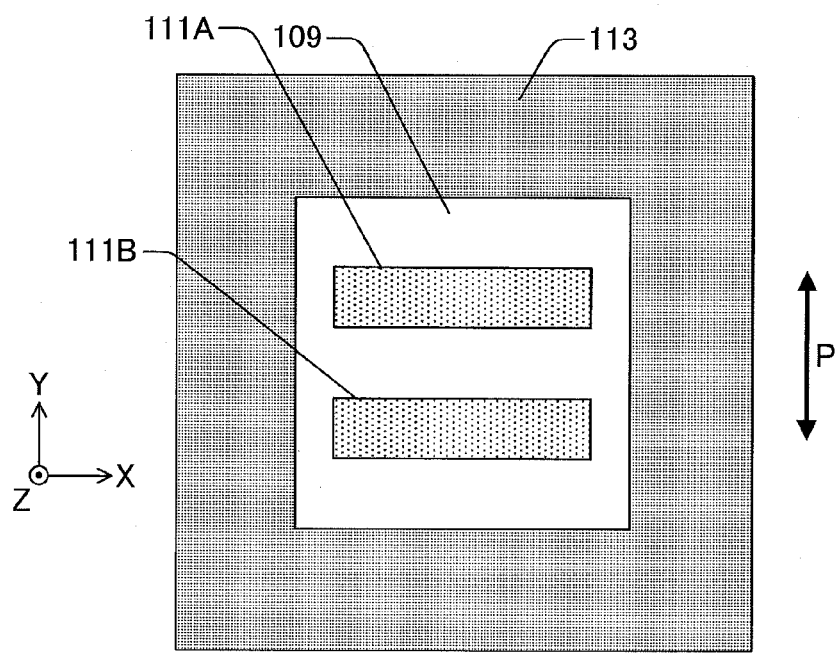
FIG. 17 is a diagram for illustrating one modification of the surface emitting laser device.
Figure 18:
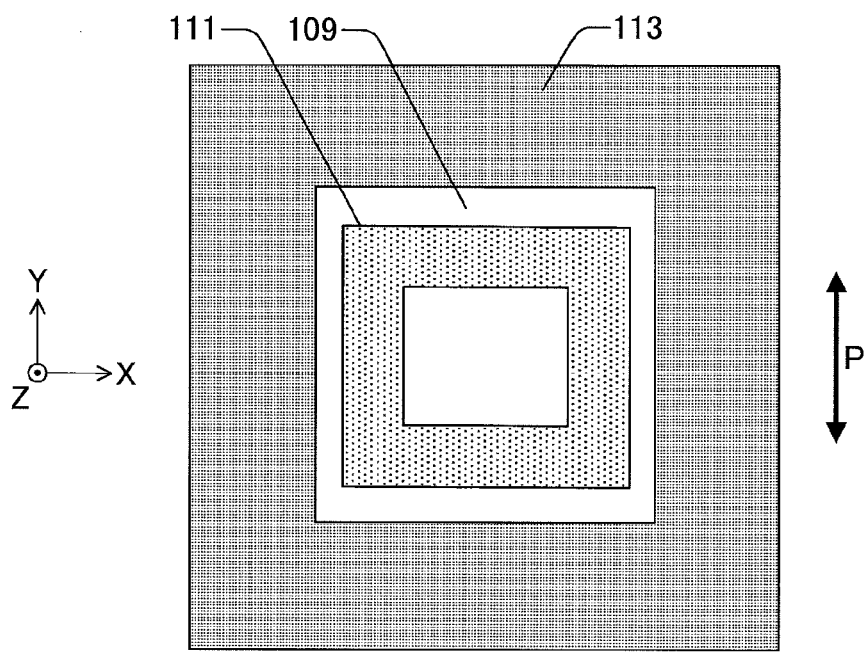
FIG. 18 is a diagram for illustrating a comparative example of the surface emitting laser device.

In FIG. 16, the reference symbol A indicates the result for the laser chip 100 according to the present embodiment. The reference symbol C indicates the result for a laser chip formed by turning the laser chip 100 by 90° around the Z-axis. FIG. 17 illustrates an example of such a laser chip. The reference symbol D indicates the result for a laser chip (comparative example) in which a single small region surrounding the central part of the light emitting region is provided and a transparent dielectric film having an optical thickness of λ/4 is formed in the small region. FIG. 18 illustrates an example of such a laser chip.

The results have revealed that the polarization direction is stable in the X-axis direction in the case of the reference symbol A, and the polarization direction is stable in the Y-axis direction in the case of the reference symbol C. In either case, the PMSR is about 5 dB or more than that of the reference symbol D. On the other hand, in the case of the reference symbol D, although the polarization direction is stable in the X-axis direction, the PMSR falls below 10 dB and the polarization direction is unstable in some cases.

That is, the results indicate that providing multiple small regions in which transparent dielectric films having an optical thickness of λ/4 are formed contributes to an improvement of the polarization stability. This improvement is considered to be attributable to anisotropy introduced into an optical confinement effect in two directions mutually orthogonal to each other (the X-axis and Y-axis directions in this case). According to the present embodiment, light whose polarization direction coincides with the X-axis direction has a lower oscillation threshold compared to light whose polarization direction coincides with the Y-axis direction due to an optical confinement effect to the central portion having a higher reflectivity than that of the peripheral portion in the light emitting region. This is considered to result in the improvement of the polarization mode suppression ratio.

Figure 19:
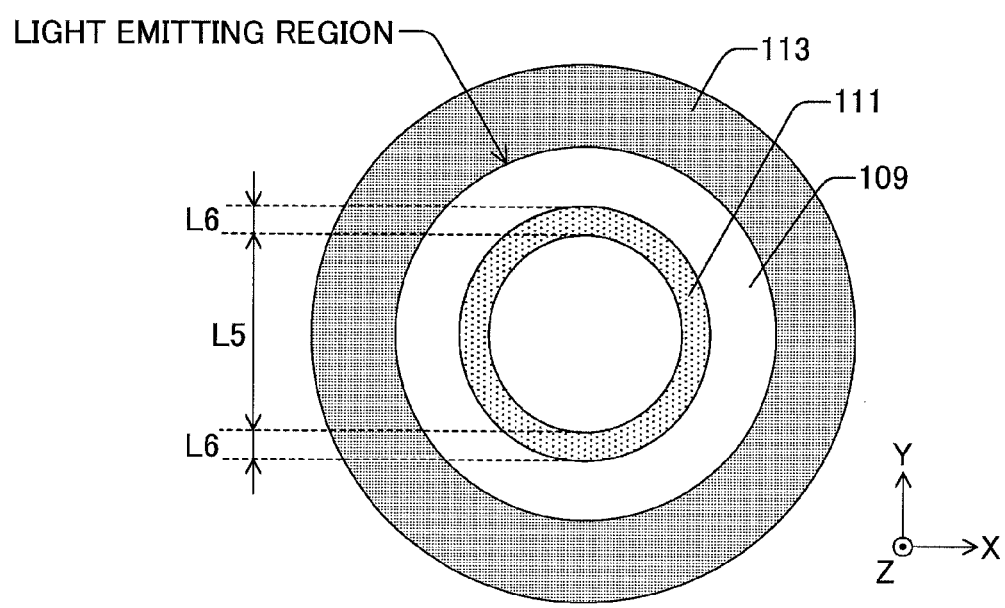
FIG. 19 is a diagram for illustrating a surface emitting laser device used to calculate a distribution of oscillation modes.

A distribution of oscillation modes has been studied by calculation using a laser chip (calculational laser chip) in which a single ring-shaped small region is provided in such a manner as to surround the central part of a circular light emitting region, as an example shown in FIG. 19, and a transparent dielectric film having an optical thickness of λ/4 is formed in the small region. The calculation is performed by changing an inner diameter L5 of the small region while fixing a width L6 of the small region to 3 μm. Note that in the calculation, the diameter of the current passage region is 4.5 μm. Note also that in FIG. 19, identical reference symbols are given to elements equivalents to those of the laser chip 100 for the sake of convenience.

Figure 20:
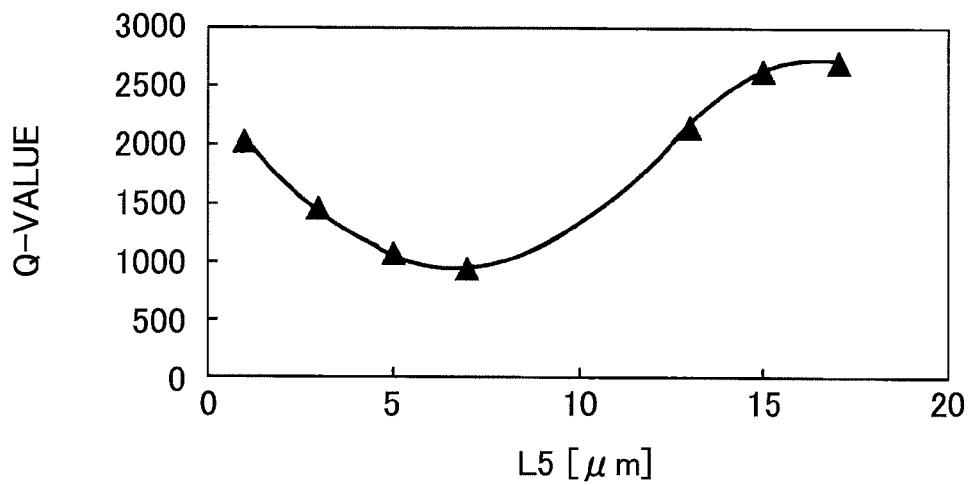
FIG. 20 is a diagram for illustrating a relationship between an inner diameter L5 of a small region of FIG. 19 and a Q-value of high-order transverse modes.

FIG. 20 shows the relationship between the inner diameter L5 of the small region and the Q-value of the higher-order transverse modes, obtained from the calculation results. It is understood that when the inner diameter L5 is progressively increased from 1 μm, the Q-value drastically decreases. This is considered to be because a portion having a high light intensity in the higher-order transverse modes overlaps the small region, and as a result, the oscillation of higher-order transverse modes is suppressed.

Figure 21:
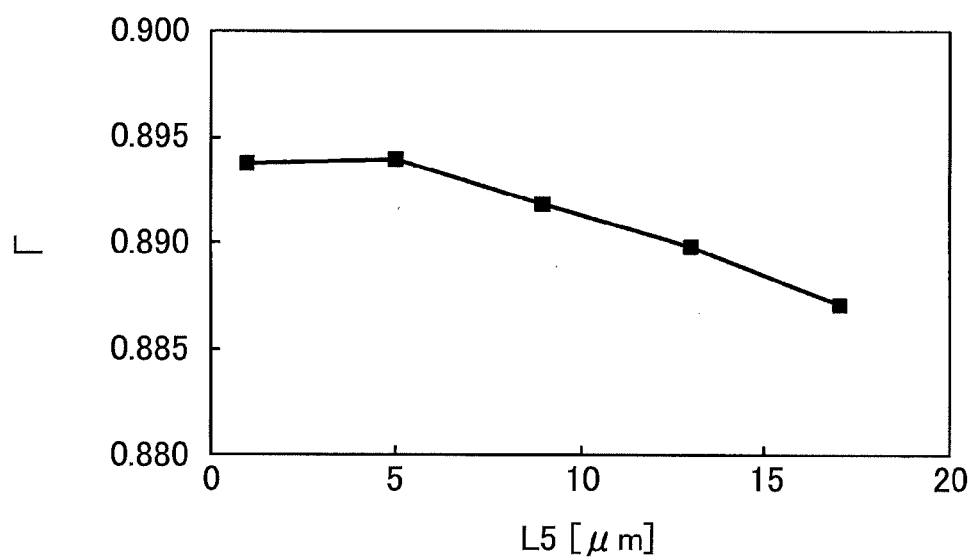
FIG. 21 is a diagram for illustrating a relationship between the inner diameter L5 of the small region of FIG. 19 and a lateral optical confinement coefficient $\Gamma$ in a fundamental transverse mode.
Figure 22:
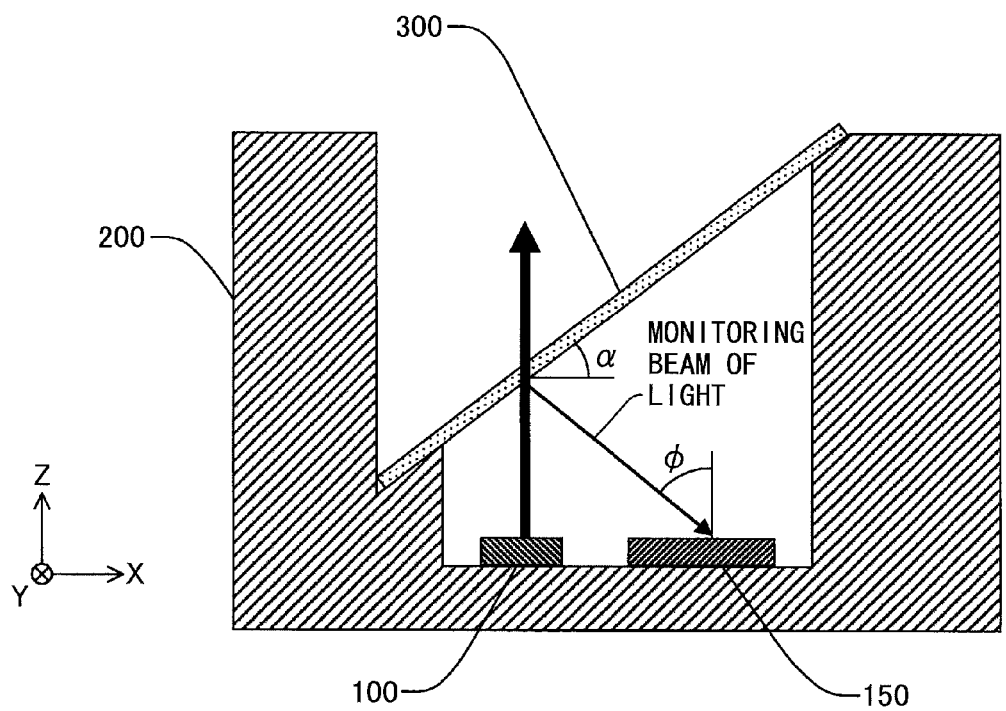
FIG. 22 is a diagram for illustrating an incident angle $\phi$ of a monitoring beam of light with respect to a light receiving surface of a light receiving element.

FIG. 21 shows the relationship between the inner diameter L5 of the small region and a lateral optical confinement coefficient Γ in the fundamental transverse mode, obtained from the calculation results. It is understood that the lateral optical confinement effect is significant when the inner diameter L5 is 5 μm or less, and that, when the inner diameter L5 is more than 5 μm, the lateral optical confinement effect decreases as the value of the inner diameter L5 increases. Therefore, by providing multiple small regions and introducing anisotropy into gaps between the small regions, it is possible to cause anisotropy in the lateral optical confinement effect. As a result, a polarization component in a direction having a strong optical confinement effect more easily oscillates compared to a polarization component in a direction having a weak optical confinement effect, which allows the polarization direction to be controlled in the direction having a strong optical confinement effect.

With reference to FIGS. 16, 20 and 21, it is understood that by introducing anisotropy into the gaps between the small regions, the central portion having comparatively higher reflectivity in the light emitting region has shape anisotropy, which results in controlling and stabilizing the polarization direction. As it can be seen from FIG. 16, the stabilized polarization direction lies in the direction of the two small regions opposing each other (the X-axis direction in this case). This is attributed to the magnitude of the optical confinement coefficient Γ or the Q-value depending on the inner diameter L5, as is noted from the calculated values. That is, when the small region has anisotropy, the polarization direction is stabilized in a direction of a shorter diameter (minor axis) of L5.

In a generalized description, the polarization direction is stabilized when light is confined in a portion having comparatively higher reflectivity in the light emitting region and shape anisotropy is present in the portion having comparatively higher reflectivity. The stabilized polarization direction lies in the shorter direction of the portion having comparatively higher reflectivity. This holds true, regardless of the configuration of the mode filter, as long as the portion having comparatively higher reflectivity has shape anisotropy. Note that the shorter direction of the portion having comparatively higher reflectivity is a direction in which the width of the portion measured through the center of the light emitting region becomes the smallest.

Next is described the relationship among the polarization direction of the beam of light entering the light receiving element 150 (the monitoring beam of light), an incident angle φ of the beam of light with respect to the light receiving element 150 (see FIG. 22) and the reflectivity of the beam of light on the surface of the light receiving element 150.

A reflectivity Rp obtained when the beam of light entering the light receiving element 150 is a p-polarized light is found by Equation (1) below, and a reflectivity Rs obtained when the beam of light entering the light receiving element 150 is an s-polarized light is found by Equation (2) below.

[Equation 1]

$$Rp = \left(\frac{n^2\cos\varphi - \sqrt{n^2 - \sin^2\varphi}}{n^2\cos\varphi + \sqrt{n^2 - \sin^2\varphi}}\right)^2 \quad (1)$$

[Equation 2]

$$Rs = \left(\frac{\cos\varphi - \sqrt{n^2 - \sin^2\varphi}}{\cos\varphi + \sqrt{n^2 - \sin^2\varphi}}\right)^2 \quad (2)$$

Note that $n=(n_2/n_1)$ where $n_1$ is a refractive index of air and $n_2$ is a refractive index of the light receiving surface of the light receiving element 150. Here, the light receiving surface of the light receiving element 150 is encapsulated with a transparent resin whose refractive index is 1.516.

Figure 23:
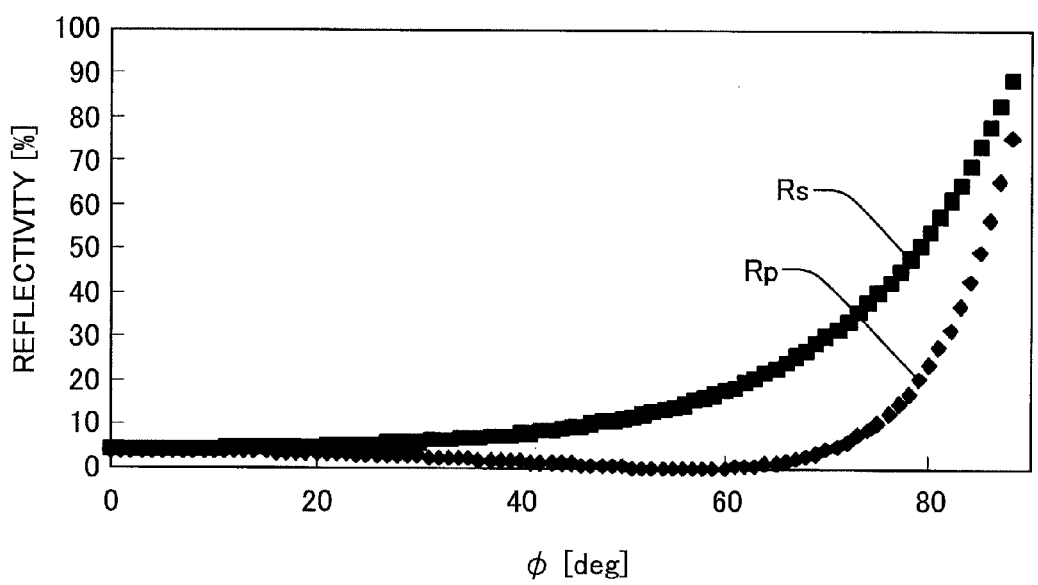
FIG. 23 is a diagram for illustrating a relationship between the incident angle $\phi$ of the monitoring beam of light with respect to the light receiving surface of the light receiving element and a reflectivity Rp, and a relationship between the incident angle $\phi$ and a reflectivity Rs.

FIG. 23 shows the relationship between the reflectivity Rp obtained by Equation (1) above and the incident angle φ and the relationship between the reflectivity Rs obtained by Equation (2) above 1.5 and the incident angle φ. According to the figure, the reflectivity Rp decreases as the incident angle φ increases from 0° and then increases after first reaching zero. On the other hand, the reflectivity Rs monotonically increases as the incident angle φ increases from 0°.

Figure 24:
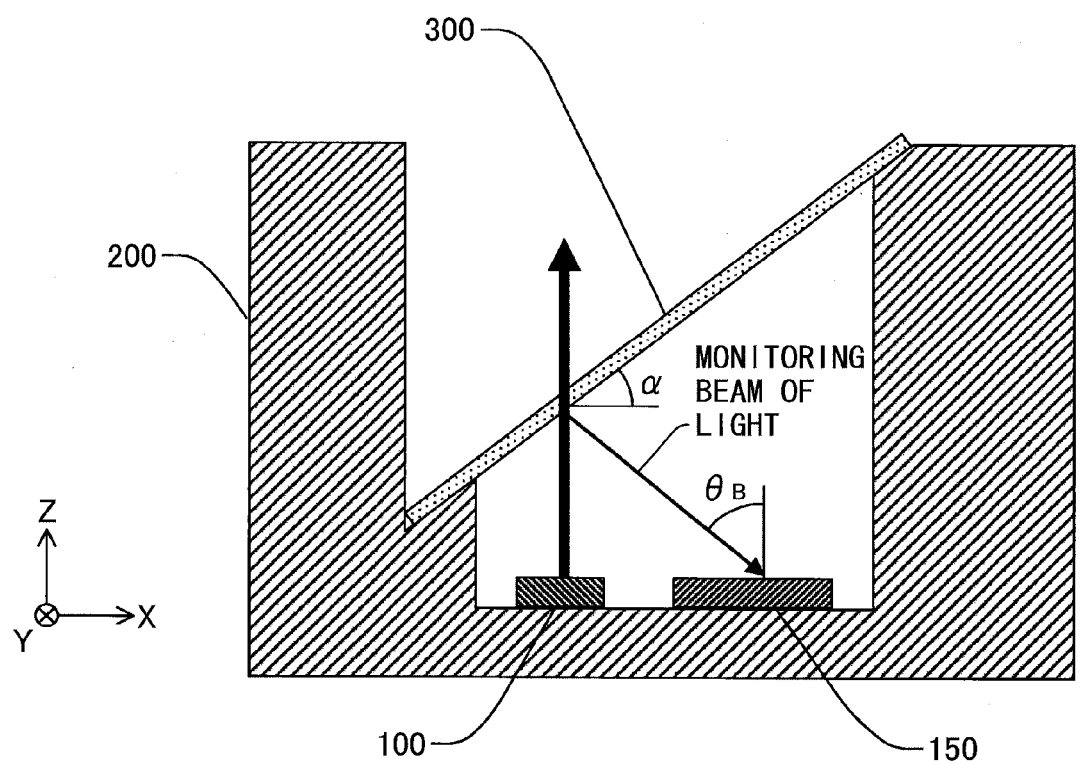
FIG. 24 is a diagram illustrating that the incident angle $\phi$ of the beam of light entering the light receiving element coincides with a Brewster angle $\theta_B$.
Figure 25:
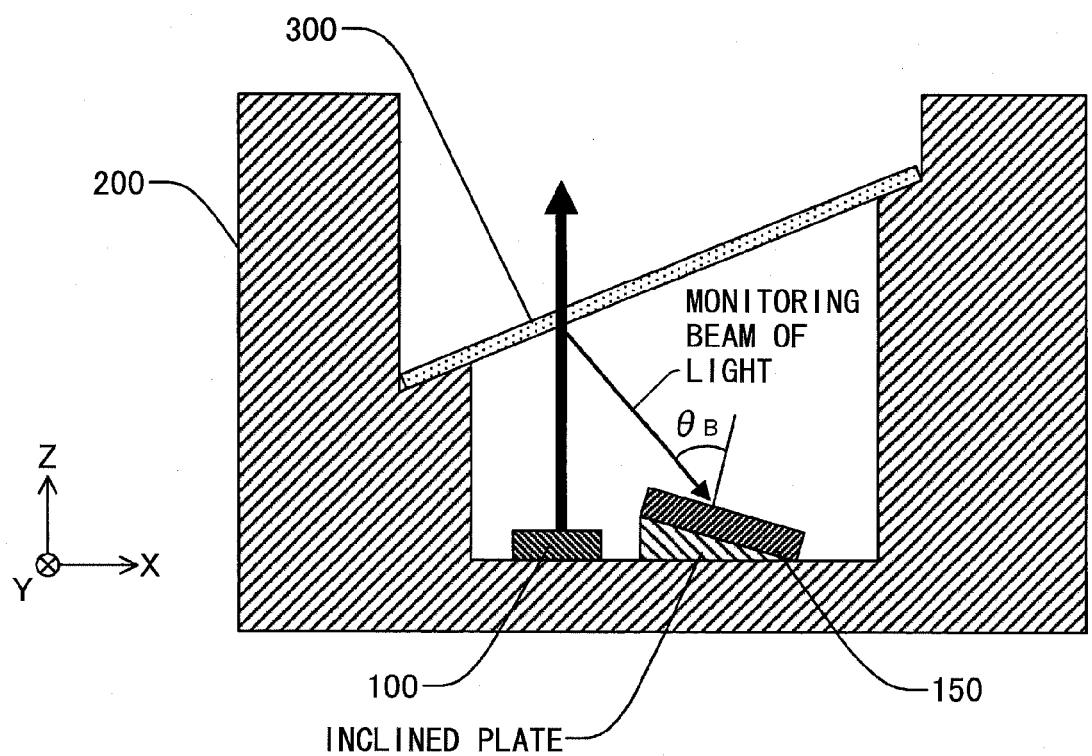
FIG. 25 is a diagram for illustrating a modification regarding an installation of the light receiving element.
Figure 26:
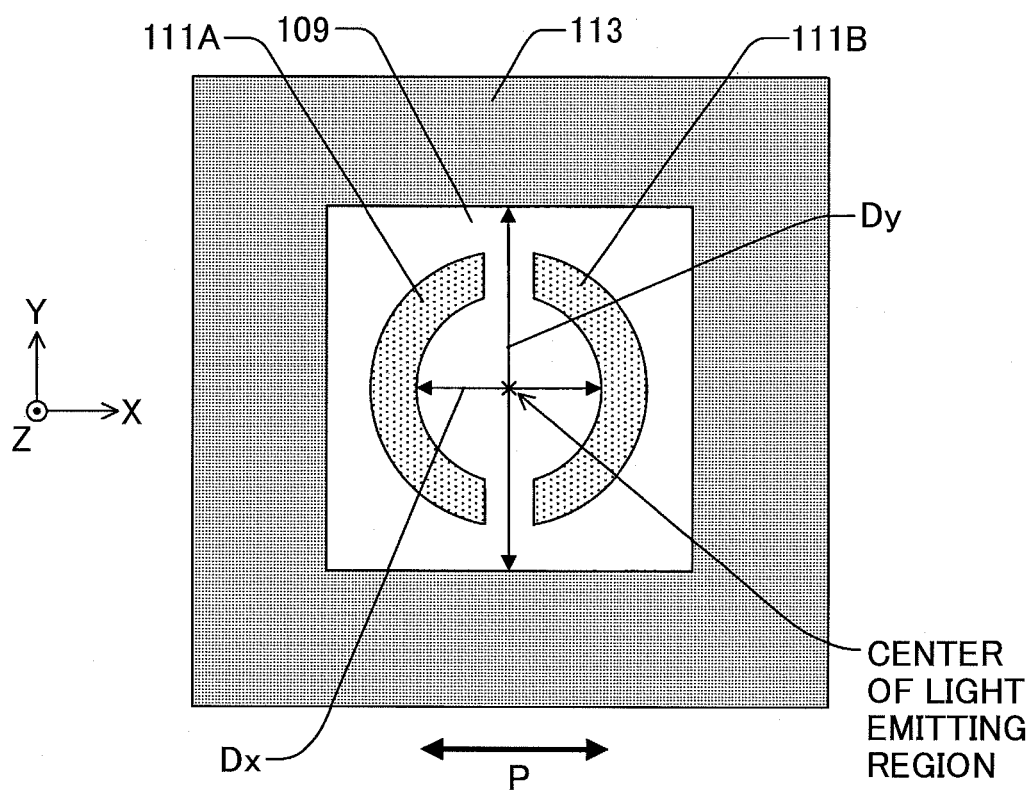
FIG. 26 is a diagram for illustrating a first modification of the mode filter.

According to the present embodiment, the laser chip 100 is disposed in such a manner that the beam of light entering the light receiving element 150 becomes a p-polarized light, and the cover glass 300 is tilted in such a manner that the incident angle φ of the beam of light entering the light receiving element 150 coincides with a Brewster angle $\theta_B$ (see FIG. 24). The Brewster angle $\theta_B$ here is about 57°.

Herewith, it is possible to make the reflectivity on the surface of the light receiving element 150 very small. As a result, almost all of the beam of light reflected by the cover glass 300 (the monitoring beam of light) is received by the light receiving element 150 and then converted into an electrical signal.

The coincidence of the incident angle φ of the beam of light entering the light receiving element 150 with the Brewster angle $\theta_B$ may be difficult to achieve using only the tilt of the cover glass 300. In such a case, the coincidence may be achieved by tilting the light receiving element 150 in relation to the X-axis direction using an inclined plate or the like, as an example shown in FIG. 25.

Then, the laser control unit 590 performs automatic power control (APC) based on an output signal of the light receiving element 150.

As has been described above, the optical device 510 according to the present embodiment includes the laser chip 100, the light receiving element 150, the package member 200 holding the laser chip 100 and the light receiving element 150, the cover glass 300 and the like.

In the laser chip 100, the rectangular transparent SiN layers 111A and 111B having an optical thickness of λ/4 and opposing each other in the X-axis direction are formed within the light emitting region.

In this case, the central portion having comparatively higher reflectivity in the light emitting region has a shape anisotropy where the width measured on a line extending in a direction parallel to the X-axis and passing through the center of the light emitting region is smaller than the width measured on a line extending in a direction parallel to the Y-axis and passing through the center of the light emitting region.

Consequently, the laser chip 100 is able to emit stable linearly-polarized light whose polarization direction is the X-axis direction while suppressing the oscillation of higher-order transverse modes without decreasing the light output in the fundamental transverse mode.

The light receiving element 150 is disposed on the +X-direction side of the laser chip 100. The cover glass 300 is disposed to tilt in the X-Z plane, in relation to the X-axis direction, in such a manner that the beam of light reflected by the surface of the cover glass 300 (the monitoring beam of light) enters the light receiving element 150 at an incident angle substantially coinciding with the Brewster angle.

In this case, it is possible that the light receiving element 150 receives almost all of the beam of light reflected by the cover glass 300 and converts the received beam of light into an electrical signal. That is, the S/N ratio can be improved as compared to conventional technologies. As a result, the laser control unit 590 is capable of performing highly accurate APC.

Accordingly, the optical device 510 is capable of emitting light in a stable manner with little variation in the amount of the light.

In addition, the optical scanning apparatus 1010 according to the present embodiment is capable of stable optical scanning since the light source unit 14 includes the optical device 510.

Furthermore, the laser printer 1000 according to the present embodiment is capable of forming high-quality images because of having the optical scanning apparatus 1010.

Image forming apparatuses using a conventional surface emitting laser device requires a monitoring optical system, such as one disclosed in Japanese Laid-open Patent Application Publication No. 2005-156933, in order to suppress the variation in the amount of light. However, according to the above embodiment, since the light receiving element 150 for monitoring the amount of light is integrally formed with the laser chip 100, such a monitoring optical system is not required, which results in size reduction and low cost production of image forming apparatuses.

The above embodiment describes the case in which each of the transparent layers 111A and 111B is rectangular in shape; however, the present invention is not limited to this case. The shape may be an arbitrary shape, such as an ellipse or a semicircle (see FIG. 26).

The above embodiment describes the case in which the transparent layers 111A and 111B are made of the same material as that of the protective layer 111; however, the present invention is not limited to this case. The transparent layers 111A and 111B may be made of $SiO_2$, for example.

Figure 27A:
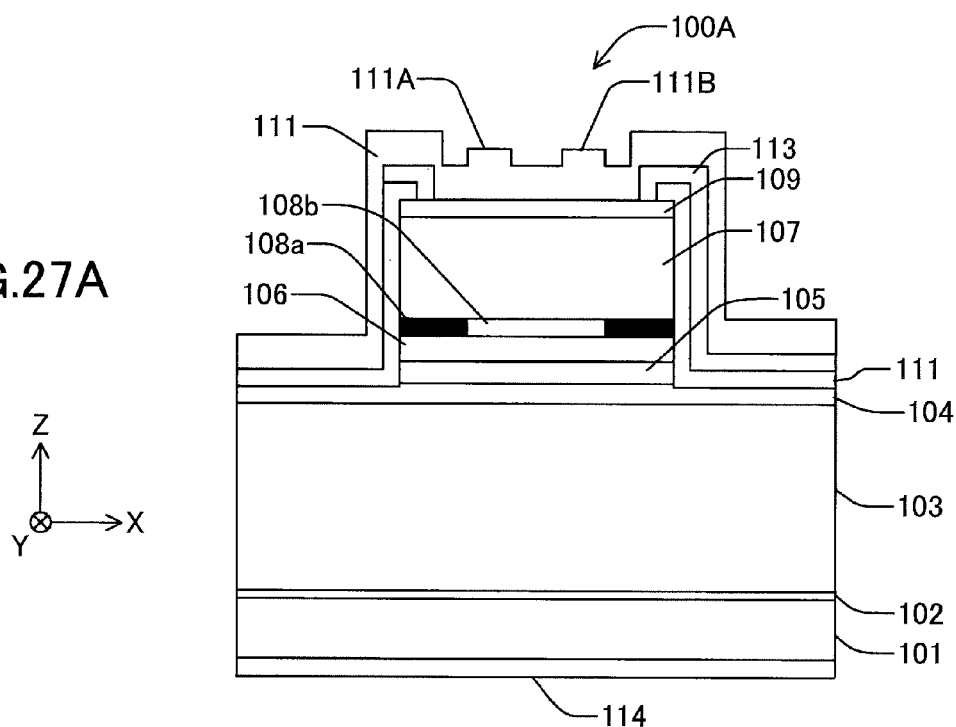
FIGS. 27A and 27B are diagrams for illustrating a modification of the laser chip (surface emitting laser device)
Figure 27B:
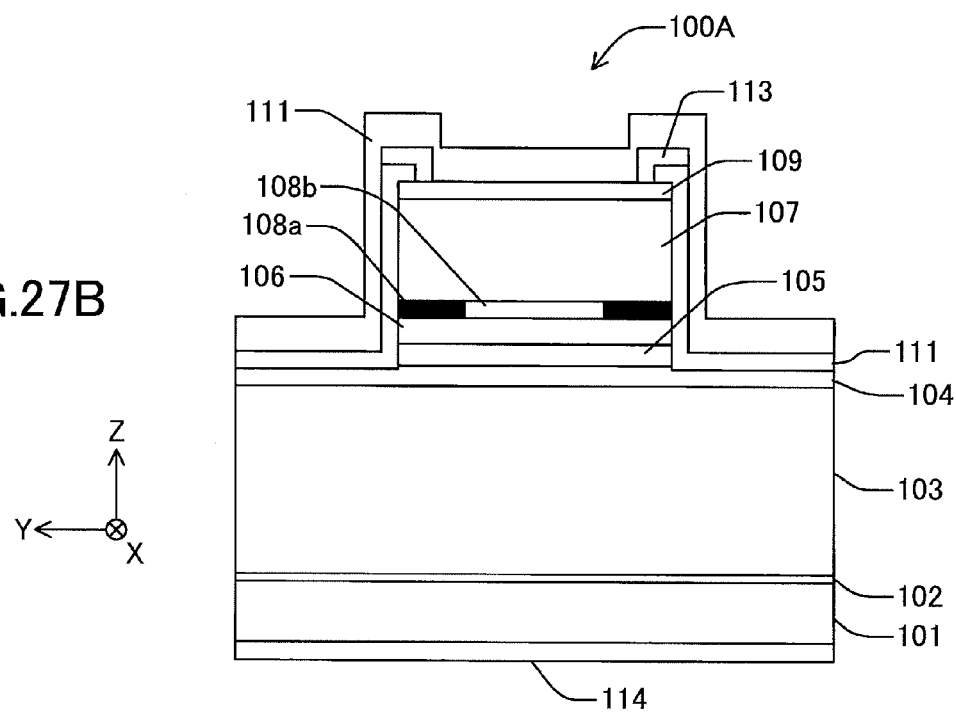

The above embodiment describes the case in which the transparent layers 111A and 111B have an optical thickness of $\lambda/4$; however, the present invention is not limited to this case. For example, the optical thickness of the transparent layers 111A and 111B may be $3\lambda/4$ as shown in FIGS. 27A and 27B. In short, the effect of suppressing high-order transverse modes similar to that of the laser chip 100 according to the above embodiment can be obtained if the optical thickness of the transparent layers 111A and 111B is an odd multiple of $\lambda/4$. Note that FIGS. 27A and 27B show cross-sectional views of a laser chip 100A in planes parallel to the X-Z plan and the Y-Z plane, respectively.

Figure 28A:
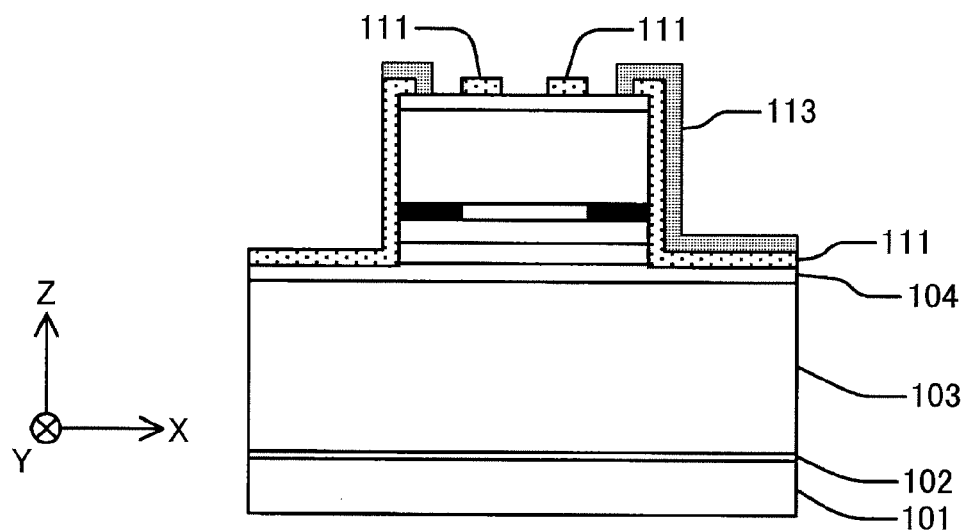
FIGS. 28A to 28C are diagrams for illustrating a method for manufacturing the modification of the laser chip (surface emitting laser device)
Figure 28B:
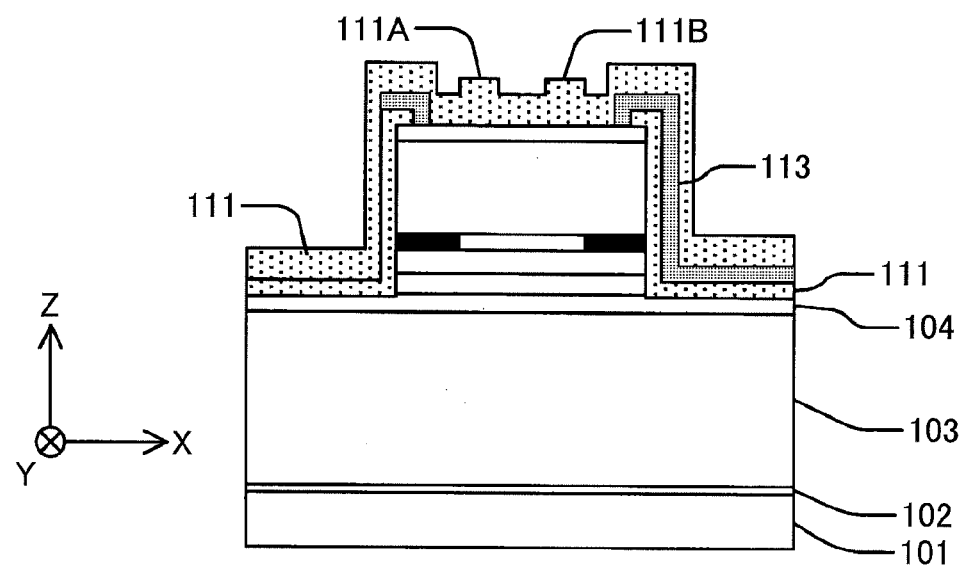
Figure 28C:
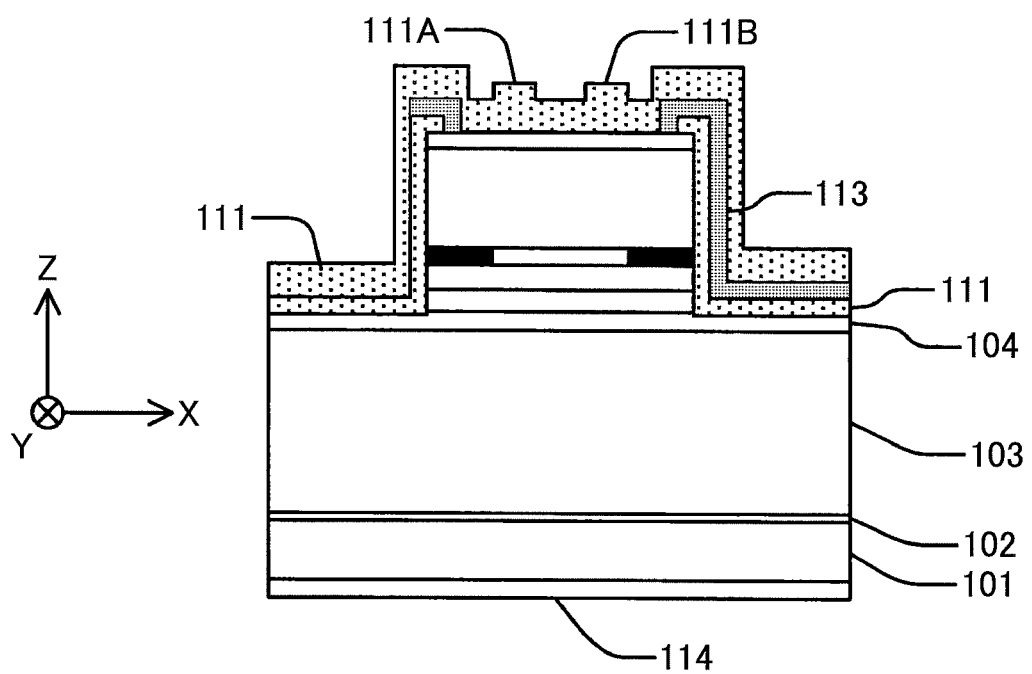

In this case, the p-electrode 113 of the above embodiment is formed as an example shown in FIG. 28A, and then, the SiN protective layer 111 is formed in such a manner as to have an optical thickness of $2\lambda/4$, as an example shown in FIG. 28B, by chemical vapor deposition (CVD). More specifically, the actual thickness ($=2\lambda/4n$) of the protective layer 111 is set to about 210 nm since the refractive index n of SiN is 1.86 and the oscillation wavelength $\lambda$ is 780 nm. Subsequently, the back side of the substrate 101 is polished so that the substrate 101 has a predetermined thickness (about 100 μm, for example), and then, the n-electrode 114 is formed (see FIG. 28C).

At this point, the central portion of the light emitting region is covered by the protective layer 111 (dielectric film) having an optical thickness of $2\lambda/4n$. Also, the peripheral portion of the light emitting region, except for the two small regions (the first and second small regions), is covered by the protective layer 111 having an optical thickness of $2\lambda/4n$.

In the laser chip 100A, since the entire light emitting surface is covered by the protective layer 111, it is possible to reduce oxidation and contamination of the light emitting surface. Note that although the central portion of the light emitting region is also covered by the protected layer 111, the reflectivity is not affected, i.e., not reduced, since the protective layer 111 covering the central portion of the light emitting region has an optical thickness of an even multiple of $\lambda/4$. As a result, the laser chip 100A achieves optical properties equivalent to those in the case when no protective layer 111 is provided over the central portion of the light emitting region.

That is, by arranging a portion desired to have a low reflectivity to have an optical thickness of an odd multiple of $\lambda/4$ while arranging the remaining portion to have an optical thickness of an even multiple of $\lambda/4$, it is possible to suppress the oscillation of higher-order transverse modes without decreasing the light output in the fundamental transverse mode.

Figure 29:
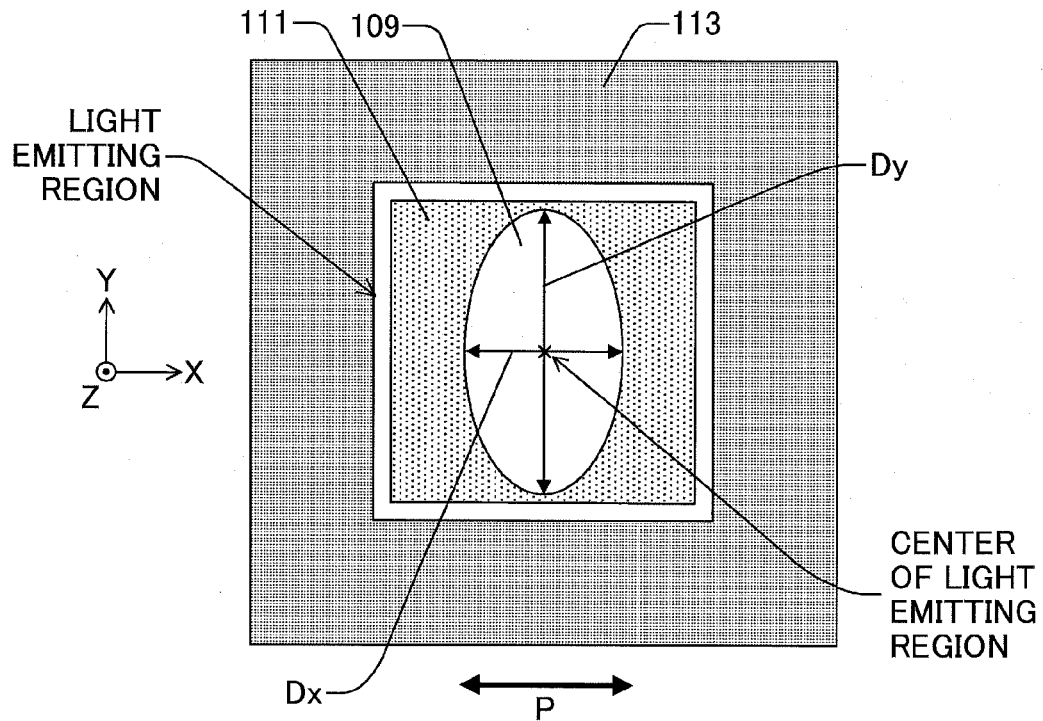
FIG. 29 is a diagram for illustrating a second modification of the mode filter.

The above embodiment describes the case in which the mode filter is made up of the two transparent layers 111A and 111B; however, the present invention is not limited to this case. For example, the mode filter may be a single transparent layer 111 having an elliptical opening in its central part, as shown in FIG. 29. In this case, the central portion having comparatively higher reflectivity in the light emitting region has an elliptical shape. By aligning the long axis direction and the short axis direction of the ellipse with the Y-axis direction and the X-axis direction, respectively, it is possible to create stable emission of linearly polarized light whose polarization direction is the X-axis direction.

Figure 30:
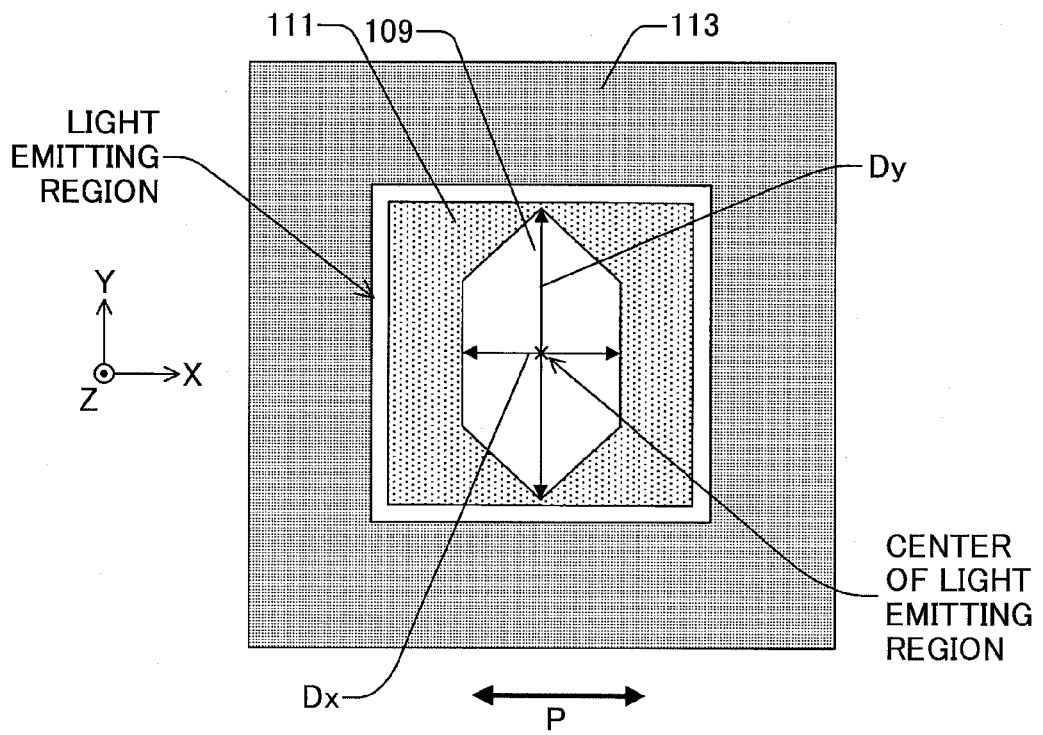
FIG. 30 is a diagram for illustrating a third modification of the mode filter.

Furthermore, the mode filter may be a single transparent layer 111 having a polygonal opening in the central part, as shown in FIG. 30. In this case, the central portion having comparatively higher reflectivity in the light emitting region has a polygonal shape. By arranging the polygonal shape to have a shape anisotropy in such a manner that the width Dx measured on a line extending in a direction parallel to the X-axis and passing through the center of the light emitting region is smaller than the width Dy measured on a line extending in a direction parallel to the Y-axis and passing though the center of the light emitting region, it is possible to create stable emission of linearly polarized light whose polarization direction is the X-axis direction.

Figure 31:
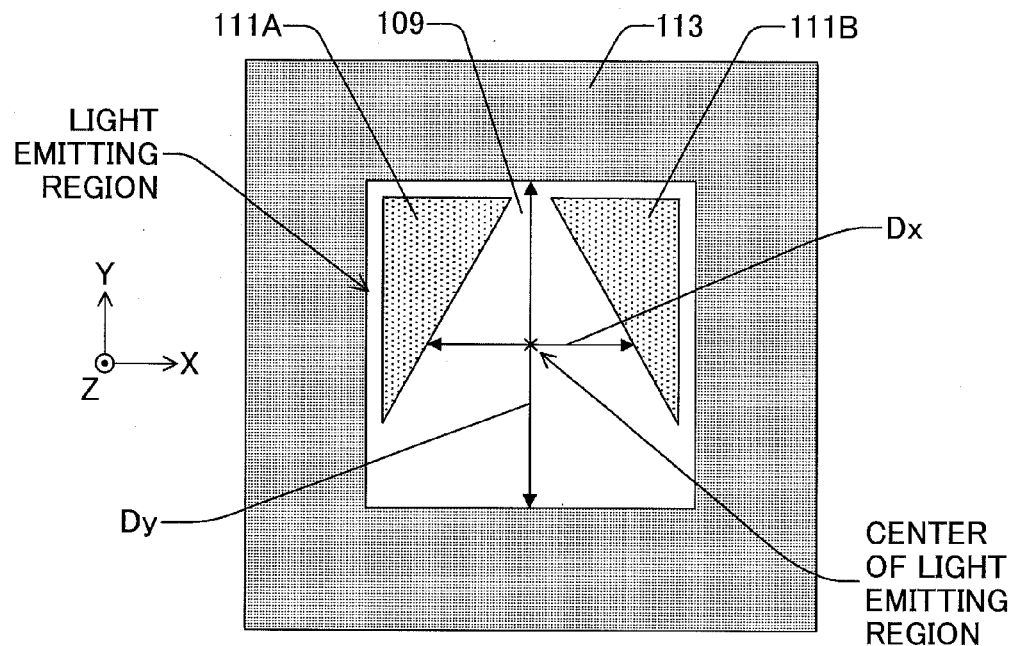
FIG. 31 is a diagram for illustrating a fourth modification of the mode filter.

As an example shown in FIG. 31, the geometric center of the mode filter made up of the transparent layers 111A and 111B does not have to coincide with the center of the light emitting region. In this case, by arranging the central portion having comparatively higher reflectivity in the light emitting region to have a shape anisotropy in such a manner that the width Dx measured on a line extending in a direction parallel to the X-axis and passing through the center of the light emitting region is smaller than the width Dy measured on a line extending in a direction parallel to the Y-axis and passing though the center of the light emitting region, it is possible to create stable emission of linearly polarized light whose polarization direction is the X-axis direction.

Figure 32:
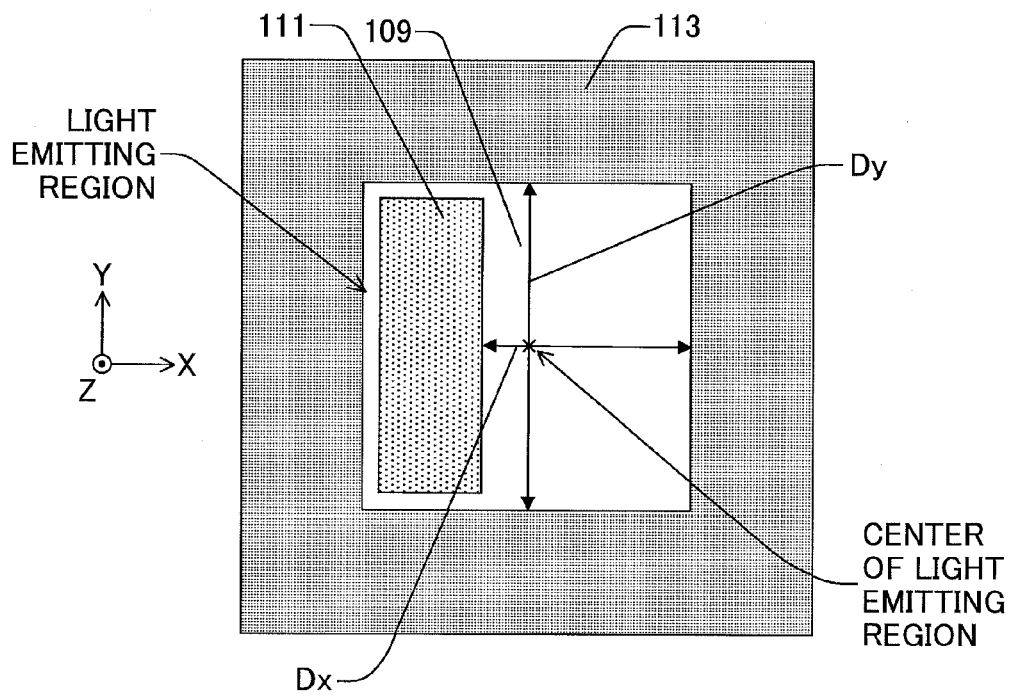
FIG. 32 is a diagram for illustrating a fifth modification of the mode filter.

As an example shown in FIG. 32, the geometric center of the mode filter formed of a single transparent layer 111 does not have to coincide with the center of the light emitting region. In this case, by arranging the central portion having comparatively higher reflectivity in the light emitting region to have a shape anisotropy in such a manner that the width Dx measured on a line extending in a direction parallel to the X-axis and passing through the center of the light emitting region is smaller than the width Dy measured on a line extending in a direction parallel to the Y-axis and passing though the center of the light emitting region, it is possible to create stable emission of linearly polarized light whose polarization direction is the X-axis direction.

Figure 33:
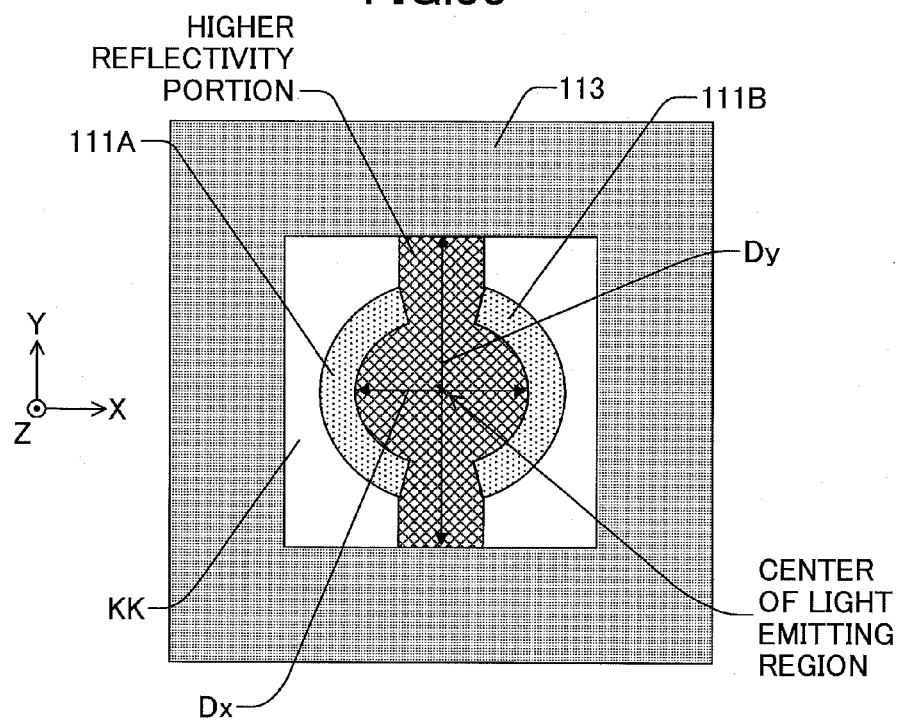
FIG. 33 is a diagram for illustrating a portion having comparatively high reflectivity.

As an example shown in FIG. 33, regions KK provided outside of the two transparent layers (111A and 111B) also have comparatively higher reflectivity; however, the regions KK have small contribution to the oscillation modes, and therefore, are not included in "the central portion having comparatively higher reflectivity in the light emitting region" specified in this specification.

Figure 34:
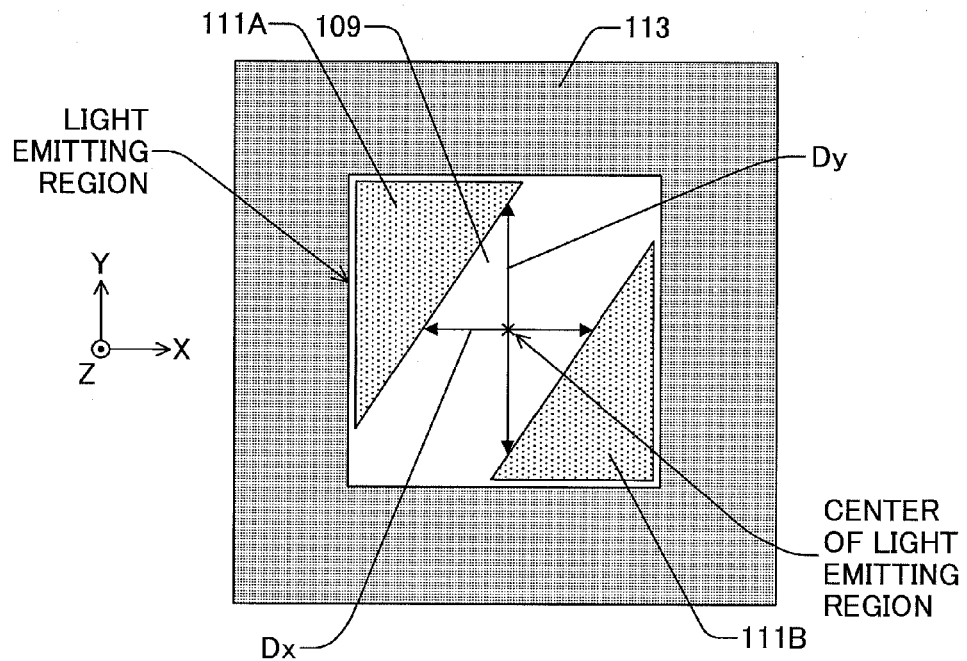
FIG. 34 is a diagram for illustrating a sixth modification of the mode filter.

As an example shown in FIG. 34, the transparent layers 111A and 111B may be triangle in shape and oppose each other across the center of the light emitting region. In this case, by arranging the central portion having comparatively higher reflectivity in the light emitting region to have a shape anisotropy in such a manner that the width Dx measured on a line extending in a direction parallel to the X-axis and passing through the center of the light emitting region is smaller than the width Dy measured on a line extending in a direction parallel to the Y-axis and passing though the center of the light emitting region, it is possible to create stable emission of linearly polarized light whose polarization direction is the X-axis direction. Note that a line connecting the geometric centers of the transparent layers 111A and 111B is not perpendicular to a straight line (a straight line parallel to the X-axis) formed by projecting, on a plane surface that includes the light emitting region, a normal line to the cover glass 300 at an incident position of the beam of light.

The above embodiment describes the case in which the incident angle φ of the beam of light entering the light receiving element 150 is made to substantially coincide with the Brewster angle $\theta_B$; however, the present invention is not limited to this case.

Figure 35:
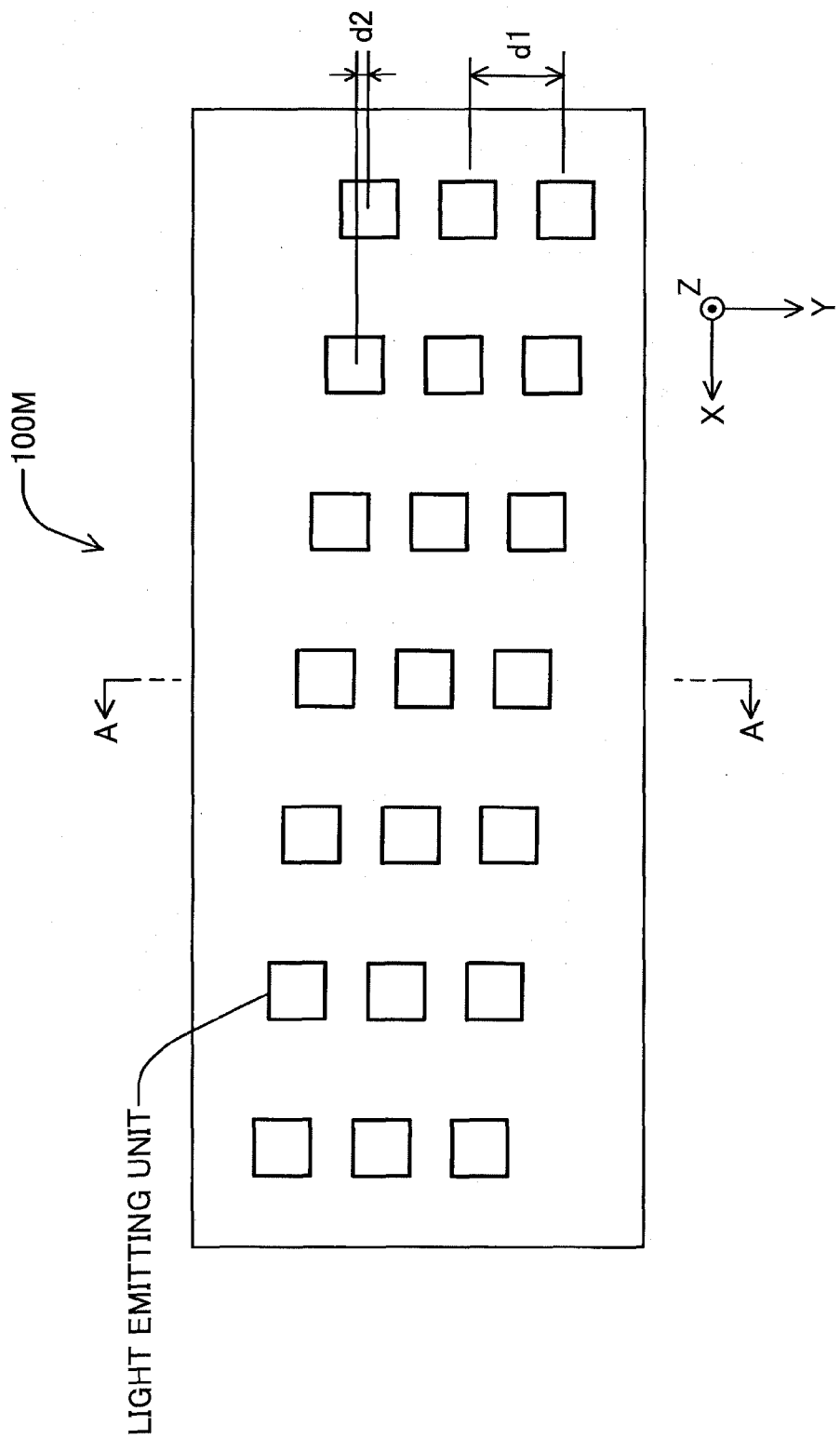
FIG. 35 is a diagram for illustrating a surface emitting laser array chip.

In the above embodiment, the optical device 510 may have, in place of the laser chip 100, a surface emitting laser array chip 100M, as an example shown in FIG. 35.

In the surface emitting laser array chip 100M, multiple light emitting units (21 in this case) are disposed on a single substrate. In FIG. 35, the X-axis direction is the main scanning corresponding direction and the Y-axis direction is the sub-scanning corresponding direction. The multiple light emitting units are disposed in such a manner that, if each light emitting unit is orthographically projected on a hypothetical line along the Y-axis direction, the center point of the light emitting unit is shifted from the center point of the nearest neighboring light emitting unit in the X-axis direction by a uniform amount d2 on the hypothetical line. That is, the 21 light emitting units are arranged in two dimensions. Note that the number of light emitting units is not limited to 21.

Figure 36:
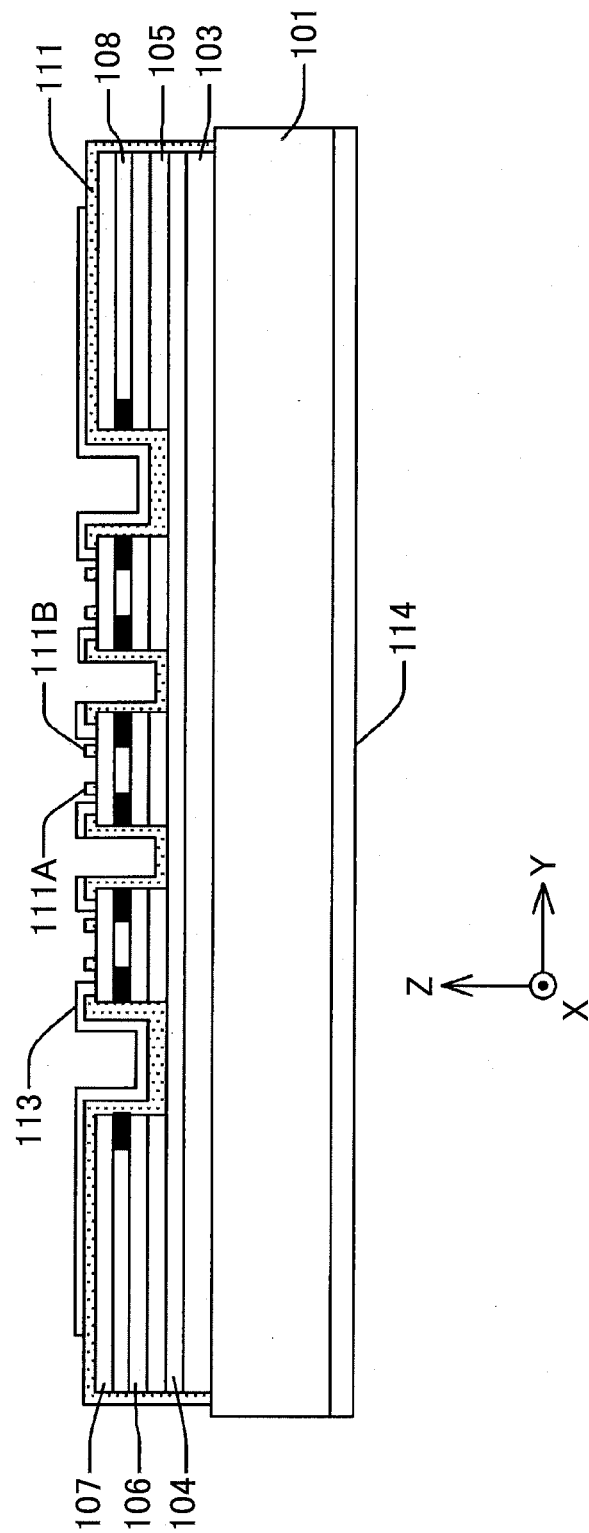
FIG. 36 is a cross-sectional diagram of FIG. 35 along line A-A.

Each light emitting unit has the same configuration as that of the above-described laser chip 100, as illustrated in FIG. 36 which is a cross-sectional view along A-A line shown in FIG. 35. The surface emitting laser array chip 100M can be manufactured in the same manner as described above for the laser chip 100. With the surface emitting laser array chip 100M, it is possible to obtain multiple laser beams operating in a single fundamental transverse mode and having a uniform polarization direction among the light emitting units. Accordingly, 21 round and small optical spots with high light density can be formed at once on the photoreceptor drum 1030.

According to the surface emitting laser array chip 100M, if the light emitting units are orthographically projected on a hypothetical line along the sub-scanning corresponding direction, the center points of the light emitting units are shifted from the center point of the nearest neighboring light emitting unit in the X-axis direction by the uniform amount d2 on the hypothetical line. Accordingly, by adjusting the lighting timing of the light emitting units, the configuration of the surface emitting laser array chip 100M is regarded on the photoreceptor drum 1030 as if the light emitting units are aligned at equal intervals in the sub-scanning direction.

If, for example, the spacing d2 is 2.65 μm and the magnification of the optical system of the optical scanning apparatus 1010 is set to 2, high-density writing with a density of 4800 dpi (dots/inch) can be achieved. In addition, a further increase in density can be achieved by increasing the number of light emitting units in the main scanning corresponding direction, narrowing spacing d1 of FIG. 35 in the sub-scanning corresponding direction so as to reduce the spacing d2 in the array configuration, or reducing the magnification of the optical system, whereby higher quality printing is achieved.

Note that the writing interval in the main scanning direction is readily controlled by adjusting the lighting timing of the light emitting units.

In this case, even if the writing dot density is increased, the laser printer 1000 is able to perform printing without slowing down the printing speed. On the other hand, in the case of not changing the writing dot density, the laser printer 1000 is able to perform printing at an increased speed.

Also, in this case, since the beams of light emitted from the respective light emitting units have a stable and uniform polarization direction, the laser printer 1000 is capable of forming high-quality images in a stable manner.

In the above embodiment, a surface emitting laser array chip having one-dimensionally arranged light emitting units similar to the laser chips 100 may be used in place of the laser chips 100.

The above embodiment describes the case in which the normal direction of the principal surface of the substrate is inclined by 15 degrees from the crystal orientation [1 0 0] toward the crystal orientation [1 1 1]A; however, the present invention is not limited to this case. It is sufficient if the normal direction of the principal surface of the substrate is inclined from a direction in the crystal orientation [1 0 0] toward a direction in the crystal orientation [1 1 1].

The above embodiment describes the case in which the oscillation wavelength of the light emitting unit is in the 780 nm band; however, the present invention is not limited to this case. The oscillation wavelength of the light emitting unit may be changed according to the characteristics of the photoreceptor.

The optical device 510 may be used in apparatuses other than image forming apparatuses. In such a case, the oscillation wavelength of the laser chip 100 may be changed to a 650 nm band, 850 nm band, 980 nm band, 1.3 μm band, 1.5 μm band or the like according to application needs. In this case, a mixed crystal semiconductor according to the oscillation wavelength may be used as a semiconductor material of the active layer 105. For example, an AlGaInP-based mixed crystal semiconductor material may be used for the 650 nm band; an InGaAs-based mixed crystal semiconductor material may be used for the 980 nm band; a GaInNAs(Sb)-based mixed crystal semiconductor material may be used for the 1.3 μm band and 1.5 μm band.

A light emitting unit corresponding to an arbitrary oscillation wavelength can be formed by selecting the materials and configuration of the reflectors in accordance with the oscillation wavelength. For example, a material other than AlGaAs mixed crystal, such as AlGaInP mixed crystal, may be used. It is preferable if the low and high refractive index layers are transparent to the oscillation wavelength, and their combination allows the difference in refractive index to be as large as possible.

In the above embodiment, the laser printer 1000 is used as an example of the image forming apparatus; however, the present invention is not limited to this case.

For example, the image forming apparatus according to the present invention may be one for projecting laser light directly onto a medium (for example, paper), on which a color is developed with the laser light.

For example, the medium may be a printing plate known as a CTP (Computer to Plate). That is, the optical scanning apparatus 1010 is suitable for image forming apparatuses which form images directly on a printing plate material by laser ablation to form a printing plate.

Also, the present invention is applicable to an image forming apparatus for projecting laser light directly onto a medium (for example, paper) capable of imparting reversibility to color development with the laser light.

For example, the medium may be so-called rewritable paper. This paper is formed by applying, as a recording layer, a material described below onto a base, such as paper and a resin film. Then, the color development and decolorization can be performed in a reversible manner by thermal energy control using laser light.

Either transparent-opaque type rewritable marking technology or coloring-discoloring type rewritable marking technology using a leuco dye can be applicable for the purpose.

A transparent-opaque type rewritable medium is formed by dispersing fatty acid microparticles in a polymer thin film. When heated at 110° C. or more, the fatty acid microparticles melt, which causes the resin to swell. Subsequently, when cooled, the fatty acid becomes supercooled and remains liquid, and the swollen resin becomes solidified. Then, the fatty acid becomes solidified and contracts to become polycrystalline microparticles, and gaps are formed between the resin and the microparticles. Light is scattered by the gaps, resulting in a white opaque appearance. Next, when heated in an erasing temperature range of 80 to 110° C., the fatty acid microparticles are partially melted and the resin is thermally expanded to fill the gaps. In this condition, when cooled, the white opaque appearance becomes transparent and images are thus erased.

The rewritable marking technology using a leuco dye employs reversible coloring/decoloring reactions of a colorless leuco dye and a developing and decoloring agent having long-chain alkyl groups. When heated by a laser light, the leuco dye and the developing and decoloring agent produce a reaction and develop color. Then, when the dye and agent are rapidly cooled, the coloration is maintained. On the other hand, when the dye and agent are slowly cooled after being heated, phase separation is caused by the autoagglutination of the long-chain alkyl groups in the developing and decoloring agent. As a result, the leuco dye and the developing and decoloring agent are physically separated, which results in decoloration.

Also, the medium may be a so-called color rewritable paper in which the following photochromic compounds are provided on a base, such as paper and a resin film: a photochromic compound which develops the color C (cyan) when irradiated by ultraviolet light and becomes transparent when irradiated by visible R (red) light; a photochromic compound which develops the color M (magenta) when irradiated by ultraviolet light and becomes transparent when irradiated by visible G (green) light; and a photochromic compound which develops the color Y (yellow) when irradiated by ultraviolet light and becomes transparent when irradiated by visible B (blue) light.

The color rewritable paper may be configured as follows instead. That is, the paper turns black when irradiated by ultraviolet light, and gives the full range of colors in response to control of color optical densities of three types of materials which develop the colors Y, M and C, respectively. The control of the color optical densities is achieved by adjusting the durations and intensities of irradiation by the R, G, and B light. Then, when continuously irradiated by the R, G, and B light having a high intensity, all the three types of materials become transparent, and thus, the paper turns white.

Such an image forming apparatus for imparting reversibility to color development by light energy control can be achieved as an image forming apparatus having an optical scanning apparatus similar to the one according to the above-described embodiment.

The present invention may be applied to an image forming apparatus using a silver salt film as an image carrier. In this case, a latent image is formed on the silver salt film by optical scanning, and then made visible by a process equivalent to the development process of regular silver halide photography. The visualized image is transferred to printing paper by a process equivalent to the printing process of the regular silver halide photography. Such an image forming apparatus is applicable as an optical plate making apparatus or an optical plotting apparatus for plotting CT scanned images and the like.

Figure 37:
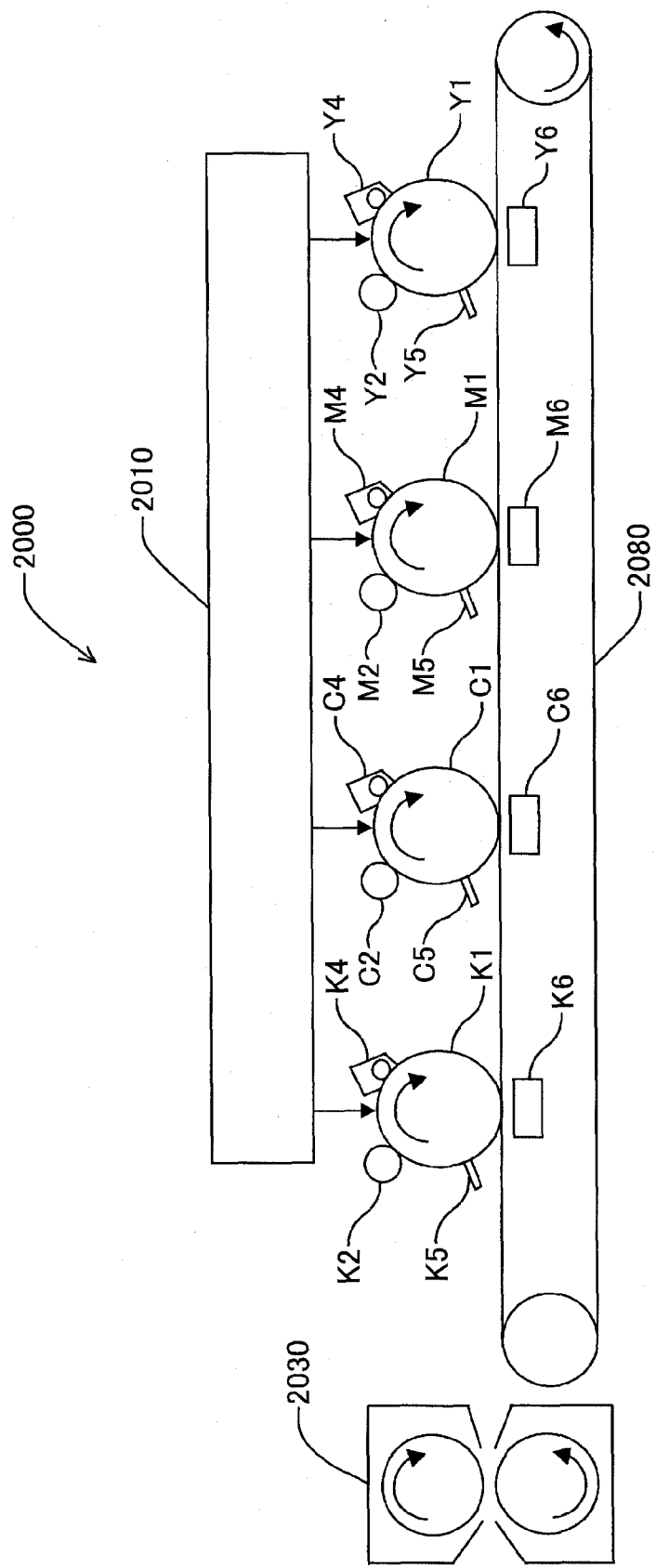
FIG. 37 is a diagram for illustrating a general structure of a multi-color printer.

The present invention may be a color printer 2000 having multiple photoreceptor drums, as an example shown in FIG. 37.

The color printer 2000 is a tandem-type multi-color printer for forming a full color image by superimposing four colors (black, cyan, magenta and yellow). The color printer 2000 includes a black photoreceptor drum K1, a black charging device K2, a black developing device K4, a black cleaning unit K5 and a black transfer device K6; a cyan photoreceptor drum C1, a cyan charging device C2, a cyan developing device C4, a cyan cleaning unit C5 and a cyan transfer device C6; a magenta photoreceptor drum M1, a magenta charging device M2, a magenta developing device M4, a magenta cleaning unit M5 and a magenta transfer device M6; a yellow photoreceptor drum Y1, a yellow charging device Y2, a yellow developing device Y4, a yellow cleaning unit Y5 and a yellow transfer device Y6; an optical scanning apparatus 2010; a transfer belt 2080; a fixing unit 2030 and the like.

Each photoreceptor drum rotates in the direction of the corresponding arrow in FIG. 37, and the corresponding charging device, developing device, transfer device and cleaning unit are sequentially disposed around the photoreceptor drum along the rotation direction. Each charging device uniformly charges the surface of the corresponding photoreceptor. The surface of the photoreceptor drum charged by the charging device is irradiated with light emitted from the optical scanning apparatus 2010, and a latent image is formed on the photoreceptor drum. Then, a toner image is formed on the surface of each of the photoreceptor drums by the corresponding developing device. The transfer devices transfer the corresponding color toner images onto a recording sheet on the transfer belt 2080, and, eventually, the transferred superimposed toner images are fixed on the recording sheet by the fixing unit 2030.

The optical scanning apparatus 2010 has, for each color, an optical device similar to the optical device 510. Accordingly, the optical scanning apparatus 2010 is able to produce an effect similar to that of the optical scanning apparatus 1010. The color printer 2000 includes the optical scanning apparatus 2010, and is therefore able to produce an effect similar to that of the laser printer 1000.

The color printer 2000 may cause color misregistration due to manufacturing errors, positional errors and the like. Even in such a case, if each of the light sources of the optical scanning apparatus 2010 includes a surface emitting laser array chip equivalent to the surface emitting laser array chip 100M, the color printer 2000 selects light emitting units to be lit, thereby reducing color misregistration.

As has been described above, the optical device according to the present invention excels at emitting light in a stable manner with little variation in the amount of the light. Also, since the light source of the optical scanning apparatus of the present invention includes the optical device, the optical scanning apparatus excels at highly accurate optical scanning. Furthermore, since including the optical scanning apparatus, the image forming apparatus according to the present invention excels at forming high-quality images.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. An optical device comprising:
   at least one surface emitting laser device having a transparent dielectric film for causing a central portion of a light emitting region to have a comparatively higher reflectivity than a peripheral portion of the light emitting region;
   a light receiving element disposed, with respect to a first direction, on one side in relation to the surface emitting laser device; and
   a transparent member disposed in a light path of light emitted from the surface emitting laser device and configured to reflect a portion of the light toward the light receiving element as monitoring light,
   wherein the central portion has a shape anisotropy in which a width measured on a line extending in the first direction and passing through a center of the light emitting region is smaller than a width measured on a line extending in a second direction, which is perpendicular to the first direction, and passing through the center of the light emitting region.

2. The optical device as claimed in claim 1, wherein the peripheral portion of the light emitting region includes a first region and a second region opposing each other across the central portion, and a line connecting geometric centers of the first region and the second region is not perpendicular to a straight line formed by projecting, on a plane surface that includes the light emitting region, a normal line to the transparent member at an incident position of the light emitted from the surface emitting laser device.

3. The optical device as claimed in claim 1, wherein an incident angle of the monitoring light with respect to a light receiving surface of the light receiving element substantially coincides with a Brewster angle.

4. The optical device as claimed in claim 1, wherein the central portion is covered by the dielectric film which has an optical thickness of an even multiple of $\lambda/4$, wherein $\lambda$ is an oscillation wavelength.

5. The optical device as claimed in claim 1, wherein the peripheral portion is covered by the dielectric film which has an optical thickness of an odd multiple of $\lambda/4$, wherein $\lambda$ is an oscillation wavelength.

6. The optical device as claimed in claim 1, wherein the dielectric film is one of a silicon dioxide film and a silicon nitride film.

7. The optical device as claimed in claim 1, further comprising a package member having a region of space surrounded by walls, wherein the surface emitting laser device and the light receiving element are disposed on a bottom surface of the region of space, and the transparent member encloses the region of space.

8. The optical device as claimed in claim 1, further comprising plural of the surface emitting laser devices.

9. An optical scanning apparatus for emitting light onto a surface to be scanned, the optical scanning apparatus comprising:
   a light source having an optical device;
   a deflector configured to deflect light emitted from the light source; and
   a scanning optical system configured to focus the deflected light onto the surface to be scanned,
   wherein the optical device includes
      at least one surface emitting laser device having a transparent dielectric film for causing a central portion of a light emitting region to have a comparatively higher reflectivity than a peripheral portion of the light emitting region;
      a light receiving element disposed, with respect to a first direction, on one side in relation to the surface emitting laser device; and
      a transparent member disposed in a light path of light emitted from the surface emitting laser device and configured to reflect a portion of the light toward the light receiving element as monitoring light,
   wherein the central portion has a shape anisotropy in which a width measured on a line extending in the first direction and passing through a center of the light emitting region is smaller than a width measured on a line extending in a second direction, which is perpendicular to the first direction, and passing through the center of the light emitting region.

10. The optical scanning apparatus as claimed in claim 9, wherein the peripheral portion of the light emitting region includes a first region and a second region opposing each other across the central portion, and a line connecting geometric centers of the first region and the second region is not perpendicular to a straight line formed by projecting, on a plane surface that includes the light emitting region, a normal line to the transparent member at an incident position of the light emitted from the surface emitting laser device.

11. The optical scanning apparatus as claimed in claim 9, wherein an incident angle of the monitoring light with respect to a light receiving surface of the light receiving element substantially coincides with a Brewster angle.

12. The optical scanning apparatus as claimed in claim 9, wherein the central portion is covered by the dielectric film which has an optical thickness of an even multiple of $\lambda/4$, wherein $\lambda$ is an oscillation wavelength.

13. The optical scanning apparatus as claimed in claim 9, wherein the peripheral portion is covered by the dielectric film which has an optical thickness of an odd multiple of $\lambda/4$, wherein $\lambda$ is an oscillation wavelength.

14. The optical scanning apparatus as claimed in claim 9, wherein the dielectric film is one of a silicon dioxide film and a silicon nitride film.

15. The optical scanning apparatus as claimed in claim 9, wherein the optical device further includes a package member having a region of space surrounded by walls, wherein the surface emitting laser device and the light receiving element are disposed on a bottom surface of the region of space, and the transparent member encloses the region of space.

16. The optical scanning apparatus as claimed in claim 9, wherein the optical device includes plural of the surface emitting laser devices.

17. An image forming apparatus comprising:
   at least one image carrier; and
   at least one optical scanning apparatus for emitting, onto the image carrier, light modulated based on image information,
   wherein the optical scanning apparatus includes a light source having an optical device;

a deflector configured to deflect light emitted from the light source; and a scanning optical system configured to focus the deflected light onto the image carrier, wherein the optical device includes at least one surface emitting laser device having a transparent dielectric film for causing a central portion of a light emitting region to have a comparatively higher reflectivity than a peripheral portion of the light emitting region;

a light receiving element disposed, with respect to a first direction, on one side in relation to the surface emitting laser device; and a transparent member disposed in a light path of light emitted from the surface emitting laser device and configured to reflect a portion of the light toward the light receiving element as monitoring light, wherein the central portion has a shape anisotropy in which a width measured on a line extending in the first direction and passing through a center of the light emitting region is smaller than a width measured on a line extending in a second direction, which is perpendicular to the first direction, and passing through the center of the light emitting region.

18. The image forming apparatus as claimed in claim 17, wherein the image information is multi-color image information.

* * * * *